United States Patent
Samuelson et al.

(10) Patent No.: US 8,455,857 B2
(45) Date of Patent: Jun. 4, 2013

(54) NANOELECTRONIC STRUCTURE AND METHOD OF PRODUCING SUCH

(75) Inventors: Lars Ivar Samuelson, Malmö (SE); Patrik Svensson, Lund (SE); Jonas Ohlsson, Malmö (SE); Truls Lowgren, Malmö (SE)

(73) Assignee: QuNano AB, Lund (SE)

( * ) Notice: Subject to any disclaimer, the term of this patent is extended or adjusted under 35 U.S.C. 154(b) by 6 days.

(21) Appl. No.: 13/227,950

(22) Filed: Sep. 8, 2011

(65) Prior Publication Data

US 2011/0316019 A1    Dec. 29, 2011

Related U.S. Application Data

(63) Continuation of application No. 11/812,226, filed on Jun. 15, 2007, now Pat. No. 8,049,203.

(30) Foreign Application Priority Data

Dec. 22, 2006    (SE) ...................................... 0602840

(51) Int. Cl.
   *H01L 33/04*    (2010.01)
   *H01L 29/06*    (2006.01)

(52) U.S. Cl.
   USPC . 257/13; 257/9; 257/17; 257/94; 257/E29.07; 257/E33.005; 977/762; 977/949; 977/950

(58) Field of Classification Search
   USPC .............. 257/9, 13, 17, 103, 94, 102, E29.07, 257/E33.005; 977/762, 949–951
   See application file for complete search history.

(56) References Cited

U.S. PATENT DOCUMENTS

| | | | |
|---|---|---|---|
| 5,196,396 | A | 3/1993 | Lieber |
| 5,252,835 | A | 10/1993 | Lieber et al. |
| 5,332,910 | A | 7/1994 | Haraguchi et al. |
| 5,362,972 | A | 11/1994 | Yazawa et al. |
| 5,381,753 | A | 1/1995 | Okajima et al. |
| 5,544,617 | A | 8/1996 | Terui et al. |

(Continued)

FOREIGN PATENT DOCUMENTS

| | | |
|---|---|---|
| EP | 0 443 920 | 8/1991 |
| EP | 0 544 408 A2 | 6/1993 |

(Continued)

OTHER PUBLICATIONS

Yazawa, M. et al, "Heteroepitaxial Ultrafine Wire-Like Growth of InAs on GaAs Substrates", *Applied Physics Letters*, Mar. 11, 1991, pp. 1080-1082, vol. 58, No. 10.

(Continued)

*Primary Examiner* — Jerome Jackson, Jr.
*Assistant Examiner* — Yu Chen
(74) *Attorney, Agent, or Firm* — The Marbury Law Group PLLC

(57) ABSTRACT

The present invention relates to semiconductor devices comprising semiconductor nanoelements. In particular the invention relates to devices having a volume element having a larger diameter than the nanoelement arranged in epitaxial connection to the nanoelement. The volume element is being doped in order to provide a high charge carrier injection into the nanoelement and a low access resistance in an electrical connection. The nanoelement may be upstanding from a semiconductor substrate. A concentric layer of low resistivity material forms on the volume element forms a contact.

7 Claims, 19 Drawing Sheets

U.S. PATENT DOCUMENTS

| | | | |
|---|---|---|---|
| 5,840,435 | A | 11/1998 | Lieber et al. |
| 5,858,862 | A | 1/1999 | Westwater et al. |
| 5,897,945 | A | 4/1999 | Lieber et al. |
| 5,899,734 | A | 5/1999 | Lee |
| 5,976,957 | A | 11/1999 | Westwater et al. |
| 5,997,832 | A | 12/1999 | Lieber et al. |
| 6,130,142 | A | 10/2000 | Westwater et al. |
| 6,130,143 | A | 10/2000 | Westwater et al. |
| 6,159,742 | A | 12/2000 | Lieber et al. |
| 6,190,634 | B1 | 2/2001 | Lieber et al. |
| 6,307,241 | B1 | 10/2001 | Awschalom et al. |
| 6,340,822 | B1 | 1/2002 | Brown et al. |
| 6,455,340 | B1 | 9/2002 | Chua et al. |
| 6,559,468 | B1 | 5/2003 | Kuekes et al. |
| 6,586,965 | B2 | 7/2003 | Kuekes |
| 6,596,377 | B1 | 7/2003 | Hersee et al. |
| 6,693,021 | B1 | 2/2004 | Motoki et al. |
| 6,709,929 | B2 | 3/2004 | Zhang et al. |
| 6,716,409 | B2 | 4/2004 | Hafner et al. |
| 6,743,408 | B2 | 6/2004 | Lieber et al. |
| 7,303,631 | B2 | 12/2007 | Conley, Jr. et al. |
| 7,309,621 | B2 | 12/2007 | Conley, Jr. et al. |
| 7,335,908 | B2 | 2/2008 | Samuelson et al. |
| 7,354,850 | B2 | 4/2008 | Seifert et al. |
| 7,445,742 | B2 | 11/2008 | Chen et al. |
| 7,521,274 | B2 * | 4/2009 | Hersee et al. .................. 438/41 |
| 8,049,203 | B2 * | 11/2011 | Samuelson et al. ............... 257/9 |
| 2002/0129761 | A1 | 9/2002 | Takami |
| 2002/0130311 | A1 | 9/2002 | Lieber et al. |
| 2002/0172820 | A1 | 11/2002 | Majumdar et al. |
| 2002/0175408 | A1 | 11/2002 | Majumdar et al. |
| 2003/0089899 | A1 | 5/2003 | Lieber et al. |
| 2003/0102444 | A1 | 6/2003 | Deppert et al. |
| 2003/0121764 | A1 | 7/2003 | Yang et al. |
| 2003/0200521 | A1 | 10/2003 | DeHon et al. |
| 2004/0003839 | A1 | 1/2004 | Curtin |
| 2004/0048409 | A1 | 3/2004 | Biwa |
| 2004/0109666 | A1 | 6/2004 | Kim |
| 2004/0175844 | A1 | 9/2004 | Yang et al. |
| 2004/0213307 | A1 | 10/2004 | Lieber et al. |
| 2004/0252737 | A1 | 12/2004 | Yi et al. |
| 2004/0262636 | A1 | 12/2004 | Yang et al. |
| 2005/0006673 | A1 | 1/2005 | Samuelson et al. |
| 2005/0011431 | A1 | 1/2005 | Samuelson et al. |
| 2005/0017171 | A1 | 1/2005 | Samuelson et al. |
| 2005/0161662 | A1 | 7/2005 | Majumdar et al. |
| 2005/0199886 | A1 | 9/2005 | Yi et al. |
| 2005/0224790 | A1 | 10/2005 | Jin et al. |
| 2005/0253138 | A1 | 11/2005 | Choi |
| 2006/0019470 | A1 | 1/2006 | Seifert et al. |
| 2006/0057360 | A1 | 3/2006 | Samuelson |
| 2006/0073680 | A1 | 4/2006 | Han et al. |
| 2006/0112466 | A1 | 5/2006 | Den |
| 2006/0125056 | A1 | 6/2006 | Samuelson et al. |
| 2006/0189018 | A1 | 8/2006 | Yi et al. |
| 2006/0223211 | A1 | 10/2006 | Mishra et al. |
| 2007/0001220 | A1 | 1/2007 | Tombler et al. |
| 2007/0057248 | A1 | 3/2007 | Yao et al. |
| 2007/0172183 | A1 | 7/2007 | Wang |
| 2007/0206488 | A1 | 9/2007 | Thelander et al. |
| 2007/0257264 | A1 | 11/2007 | Hersee et al. |
| 2007/0286945 | A1 | 12/2007 | Lahnor et al. |
| 2008/0036038 | A1 | 2/2008 | Hersee et al. |
| 2008/0149946 | A1 | 6/2008 | Kim et al. |
| 2010/0025673 | A1 | 2/2010 | Hu et al. |
| 2010/0078055 | A1 * | 4/2010 | Vidu et al. .................. 136/244 |

FOREIGN PATENT DOCUMENTS

| | | |
|---|---|---|
| EP | 0 838 865 | 4/1998 |
| EP | 0 544 408 B1 | 1/2000 |
| EP | 1 221 722 A1 | 7/2002 |
| EP | 1 314 189 | 5/2003 |
| EP | 1 342 075 | 9/2003 |
| EP | 1727216 A2 | 11/2006 |
| JP | 2000-068493 | 3/2000 |
| WO | WO 95/02709 | 1/1995 |
| WO | WO 97/31139 | 8/1997 |
| WO | WO 01/03208 | 1/2001 |
| WO | WO 01/77726 | 10/2001 |
| WO | WO 01/84238 | 11/2001 |
| WO | WO 02/01648 | 1/2002 |
| WO | WO 02/17362 A2 | 2/2002 |
| WO | WO 02/48701 A2 | 6/2002 |
| WO | WO 02/080280 | 10/2002 |
| WO | WO 02/095883 A2 | 11/2002 |
| WO | WO 03/005450 | 1/2003 |
| WO | WO 03/053851 | 7/2003 |
| WO | WO 03/063208 | 7/2003 |
| WO | WO 2004/010552 | 1/2004 |
| WO | WO 2004/038767 | 5/2004 |
| WO | WO 2006/135336 A1 | 12/2006 |

OTHER PUBLICATIONS

Haraguchi, K. et al., "GaAs p-n junction formed in quantum wire crystals", *Applied Physics Letters*, Feb. 10, 1992, pp. 745-747, vol. 60, No. 6.

Yazawa, M., et al., "Effect of one monolayer of surface gold atoms on the epitaxial growth of InAs nanowhiskers", *Applied Physics Letters*, Oct. 26, 1992, pp. 2051-2053, vol. 61.

Yazawa, M., "Nanocolumns composed of GaAs—InAs jointed whiskers and Si02 covers", *Applied Physics Letters*, Aug. 29, 1994, pp. 1157-1158, vol. 65.

Sato, T., "Site-controlled growth of nanowhiskers", *Applied Physics Letters*, Jan. 9, 1995, pp. 159-161, vol. 66.

Hiruma, K., et al., "Growth and optical properties of nanometerscale GaAs and InAs whiskers", *Applied Physics Review*, Jan. 15, 1995, pp. 447-462, vol. 77.

Hiruma, K., et al., "Growth and Characterization of Nanometer-Scale GaAs, AiGaAs and GaAs/InAs Wires", *IEICE Trans. Electron.*, Sep. 1, 1994, pp. 1420-1425, vol. E77-C, No. 9.

Hiruma, K., et al., "Gas free-standing quantum-size wires", *Journal of Applied Physics*, Sep. 1, 1993, pp. 3162-3171, vol. 74.

Haraguchi, K., et al., "Polarization dependence of light emitted from GaAs p-n junctions in quantum wire crystals", *Journal of Applied Physics*, Apr. 15, 1994, pp. 4220-4225, vol. 75.

Hiruma, K., et al., Self-organized growth of GaAs/InAs heterostructure nanocylinders by organometallic vapor phase epitaxy, *Journal of Crystal Growth*, Jan. 1, 1996, pp. 226-231, vol. 163.

Lieber, C., "Nanowires as Building Blocks for Nanoscale Science and Technology", *Abstracts of Papers of the Amer. Chem Soc.*, Aug. 18, 2002, pp. 033—Camp Part 1, vol. 224.

Duan, X. et al., "Laser Assisted Catalytic Growth of Single-Crystal Compound Semiconductor Nanowires", *Abstracts of Papers of- the Amer. Chem. Soc.*, Mar. 26, 2000, pp. 676—Inor Part 1, vol. 219.

Duan, X. et al., "Laser Assisted Catalytic Growth of Semiconductor Nanowires for Nanoscale Electronic Optoelectronic Device Application", *Abstracts of Papers of- the Amer. Chem Soc.*, Apr. 1, 2001, pp. 644—Inor Part 1, vol. 221.

Lieber, C., "Semiconductor Nanowires: Building Blocks for Nanoscale Science and Technology", *Abstracts of Papers of- the Amer. Chem. Soc.*, Aug. 1, 2001, pp. 383—Phys Part 2, vol. 222.

Huang, Y., et al., "Integrated Optoelectronics Assembled from Semiconductor Nanowires", *Abstracts of Papers of- the Amer. Chem. Soc.*, Aug. 18, 2002, pp. 039—Phys Part 2, vol. 224.

Hu, J. et al., "Chemistry and Physics in One Dimension: Synthesis and Properties of Nanowires and Nanotubes", *Acc. Chem. Res.*, Feb. 20, 1999, pp. 435-445, vol. 32, No. 5.

Duan, X. et al., "General Synthesis of Compound Semiconductor Nanowires", *Advanced Materials*, Jan. 1, 2000, pp. 298-302, vol. 12, No. 4.

Duan, X., et al., "Synthesis and optical properties of gallium arsenide nanowires", *Applied Physics Letters*, Feb. 28, 2000, pp. 1116-1118, vol. 76, No. 9.

Cui, Y., et al., "Diameter-controlled synthesis of single-crystal silicon nanowires", *Applied Physics Letters*, Apr. 9, 2001, pp. 2214-2216, vol. 78, No. 15.

Gudiksen, M.S., et al., "Diameter-selective synthesis of semiconductor nanowires", *J. Am. Chem. Soc.*, Aug. 22, 2000, pp. 8801-8802, vol. 122.

Gudiksen, M.S., et al., "Size-Dependent Photoluminescence from Single Indium Phosphide Nanowires", *Journal of Physical Chemistry B*, Mar. 30, 2002, pp. 4036-4039, vol. 106, No. 16.

Duan, X., et al., "Laser-Assisted Catalytic Growth of Single Crystal GaN Nanowires", *Journal of Amer. Chem. Soc.*, Dec. 18, 1999, pp. 188-189, vol. 122, No. 1.

Huang, Y., et al., "Gallium Nitride Nanowire Nanodevices", *Nano Letters*, Jan. 11, 2002, pp. 81-82, vol. 2, No. 2.

Lieber, C., "Nanowire Sugerlattices", *Nano Letters*, Jan. 25, 2002, pp. 82-82, vol. 2, No. 2.

Duan, X., et al., "Nonvolatile Memory and Programmable Logic from Molecule-Gated Nanowires", *Nano Letters*, May 1, 2002, pp. 487-490, vol. 2, No. 5.

Cui, Y., et al., "High Performance Silicon Nanowire Field Effect Transistors", *Nano Letters*, Jan. 1, 2003, pp. 149-152, vol. 3, No. 2.

Zhong, Z., et al., "Synthesis of P-Type Gallium Nitride Nanowires for Electronic and Photonic Nanodevices", *Nano Letters*, Feb. 20, 2003, pp. 343-346, vol. 3, No. 3.

Hu, J., et al., "Controlled Growth and Electrical Properties of Heterojunctions of Carbon Nanotubes and Silicon Nanowires", *Nature*, May 6, 1999, pp. 48-51, vol. 399.

Duan, X., et al., "Indium phosphide nanowires as building blocks for nanoscale electronic and optoelectronic devices" *Nature*, Jan. 4, 2001, pp. 66-69, vol. 409.

Gudiksen, M.S., et al., "Growth of nanawire superlattice structures for nanoscale photonics and electronics", *Nature*, Feb. 7, 2002, , pp. 617-620, vol. 415.

Lauhon, L., et al., "Epitaxial Core-Shell and Core-Multishell Nanowire Heterostructures", *Nature*, Nov. 7, 2002, pp. 57-61, vol. 420, No. 6911.

Duan, X., "Single-nanowire electrically driven lasers", *Nature*, Jan. 16, 2003, pp. 241-244, vol. 421.

Lieber, C., "The incredible shrinking circuit", *Sci. Am.*, Sep. 1, 2001, pp. 58-64, vol. 285.

Morales, A., et al., "A Laser Ablation Method for the Synthesis of Crystalline Semiconductor Nanowires", *Science*, Jan. 9, 1998, pp. 208-211, vol. 279.

Cui, Y., et al., "Functional Nanoscale Electronic Devices Assembled Using Silicon Nanowire Building Blocks", *Science*, Feb. 2, 2001, pp. 851-853, vol. 291.

Wang, J., et al., "Highly Polarized Photoluminesence and Photodetection from Single Indium Phosphide Nanowires", *Science*, Aug. 24, 2001, pp. 1455-1457, vol. 293, No. 5534.

Cui, Y., et al., "Nanowire nanosensors for highly sensitive and selective detection of biological and chemical species", *Science*, Aug. 17, 2001, pp. 1289-1292, vol. 293.

Huang, Y., et al., "Logic Gates and Computation from Assembled Nanowire Building Blocks", *Science*, Nov. 9, 2001, pp. 1313-1317, vol. 294.

Cui, Y., et al., "Doping and Electrical Transport in Silicon Nanowires", *The Journal of Physical Chemistry B*, May 11, 2000, pp. 5213-5216, vol. 104, No. 22.

Gudiksen, M.S., et al., "Synthetic Control of the Diameter and Length of Single Crystal Semiconductor Nanowires", *The Journal of Physical Chemistry B*, Apr. 18, 2001, pp. 4062-4064, vol. 105.

Morales, A., et al., "Rational Synthesis of Silicon Nanowires", *INOR*, 651, Jan. 1, 2001.

Wong, E., et al., "Nanobeam Mechanics: Elasticity, Strength, and Toughness of Nanorods and Nanotubes", *Science*, Sep. 26, 1997, pp. 1971-1975, vol. 277.

Dai, H., et al., "Synthesis and Characterization of Carbide Nanorods", *Nature*, Jun. 29, 1995, pp. 769-772, vol. 375.

Junno, T., et al., "Controlled manipulation of nanogarticles with an atomic force microscope", *Applied Physics Letters*, Jun. 26, 1995, pp. 3627-3629, vol. 66.

Zwiller, V., et al., "Single quantum dots emit single photons at a time: Antibunching experiment", *Applied Physics Letters*, Apr. 23, 2001, pp. 2476-2478, vol. 78, No. 17.

Borgstrom, M., et al., "High peak-to-valley ratios observed in InAs/InP resonant tunneling quantum dot stacks", *Applied Physics Letters*, May 21, 2001, pp. 3232-3234, vol. 78, No. 21.

Thelander, et al., "Gold manoparticle single-electron transistor with carbon nanotube leads" *Applied Physics Letters*, Sep. 24, 2001, pp. 2106-2108, vol. 79, No. 13.

Ohlsson, B.J., et al., "Size-, shape-, and position-controlled GaAs nono-whiskers", *Applied Physics Letters*, Nov. 12, 2001, pp. 3335-3337, vol. 79, No. 20.

Bjork, M.T., et al., :One-dimensional heterostructures in semiconductor nanowhiskers, *Applied Physics Letters*, Feb. 11, 2002, pp. 1058-1060, vol. 80, No. 6.

Persson, M.P. et al., "Electronic Structure of Nanometer-Scale GaAs Whiskers", *Applied Physics Letters*, Aug. 12, 2002, pp. 1309-1311, vol. 81, No. 7.

Thelander, C., et al., "Single-Electron Transistors in Heterostructure Nanowires", *Applied Physics Letters*, Sep. 8, 2003, pp. 2052-2054, vol. 83, No. 10.

Panev, N., et al., "Sharp Exciton Emission From Single InAs Quantum Dots in GaAs Nanowires", *Applied Physics Letters*, Sep. 15, 2003, pp. 2238-2240, vol. 83, No. 11.

Bjork, M.T., "Nanowire resonant tunnelling diodes", *Applied Physics Letters*, Dec. 2, 2002, pp. 4458-4460, vol. 81, No. 23.

Persson, A., "Oriented Growth of InAs-based Nanowhiskers", *Diploma Work, Lund Institute of Technology, Lund University*, May 29, 2001, pp. 1-48.

Ohlsson, J., "Semiconductor Hetero- and Nanostructures", *Doctoral Thesis, Lund Institute of Technology*, Lund University, Nov. 23, 2001.

Thelander, C., "Quantum Devices from the Assembly of Zero-and One-Dimensional Building Blocks", *Doctoral Thesis*, Lund University, Nov. 7, 2003.

Ohlsson, B., et al., "Anisotropic GaAs island phase grown on flat Gap: A stranski-Krastanow-formed corrugated surface", *Journal of Applied Physics*, May 15, 2001, pp. 5726-5730, vol. 89, No. 10.

Magnusson, M., et al., "Gold nanogarticles: Production, reshaping, and thermal charging", *Journal of Nanoparticle Research*, Jan. 1, 1999, pp. 243-251, vol. 1.

Samuelson, L., "Self-Forming Nanoscale Devices", *Materials Today*, Oct. 22, 2003, pp. 22-31.

Ohlsson, B., et al., "Fabrication and characterization of III-V nanowhiskers", *MSS10 Conference*—Austria Jul. 23-27, 2001.

Bjork, M.T., et al., "One-dimensional Steeplechase for Electrons Realized", *Nano Letters*, Jan. 19, 2002, pp. 87-89, vol. 2, No. 2.

Martensson, T., et al., "Fabrication of Individually Seeded Nanowire Arrays by Vapour-Liquid-Solid Growth", *Nanotechnology*, Oct. 17, 2003, pp. 1255-1258, No. 14.

Burgess, D.S., "Nanowire Heterostructures Form Tunneling Diodes", *Photonics Spectra*, pp. 3-5, vol. 37, No. 2.

Pettersson, H., et al., "Electrical and Optical Properties of Self-Assembled InAs Quantum Dots in InP Studied by Space-Charge Spectroscopy and Photoluminescence", *Phys. Rev. B.*, Feb. 15, 2000, pp. 4795-4800, vol. 61, No. 7.

Ohlsson, B.J., et al., "Growth and characterization of GaAs and InAs nano-whiskers and InAs/GaAs heterostructures", *Physica E.*, Mar. 1, 2002, pp. 1128-1130, No. 13.

Samuelson, L., et al., "Tunnel-Induced Photon Emission in Semiconductors Using an STM", *Physics Scripta*, Jan. 1, 1992, pp. 149-152, vol. T42.

Seifert, W. et al, "In-Situ Growth of Quantum Dot Structures by the Stranski-Krastanow Growth Mode", *Prog. Crys. Growth Charact.*, Jan. 1, 1996, pp. 423-471, vol. 33.

Persson, M., "Tight-Binding Simulation of Nanocrystalline Particles and Whiskers", *Tekn lic thesis*, Lund University, Aug. 1, 2002.

Bjork, M., "Semiconductor Nanowires and Devices", *Tekn lic thesis*. Lund University, Nov. 1, 2002.

Murphy, C.J., et al., "Controlling the Aspect Ratio of Inorganic Nanorods and Nanawires", *Advanced Materials*, Jan. 4, 2002, pp. 80-82, vol. 14, No. 1.

Wagner, R.S., et al., "Vapour-Liquid-Solid Mechanism of Single Crystal Growth", *Applied Physics Letters*, Mar. 1, 1964, pp. 89-90, vol. 4, No. 5.

Canham, L.T., "Silicon Quantum Wire Array Fabrication by Electrochemical and Chemical Dissolution of Wafers", *Applied Physics Letters*, Sep. 3, 1990, pp. 1046-1048, vol. 57.

Koga, T., et al., "Carrier Pocket Engineering Applied to Strained . . . ", *Applied Physics Letters*, Oct. 18, 1999, pp. 2438-2440, vol. 75.

Koga, T., et al., "Experimental Proof-of-Principle Investigation of Enhanced $Z_{3d}T$ in (001) Oriented Si/Ge Superlattices", *Applied Physics Letters*, Sep. 4, 2000, pp. 1490-1492, vol. 77, No. 10.

Narihiro, M., et al., "Resonant tunneling of electrons via 20 nm scale InAs quantum dot and magnetotunneling spectroscopy of its electronic states", *Applied Physics Letters*, Jan. 6, 1997, pp. 105-107, vol. 70, No. 1.

Pan, Z., et al., "Conduction band offset and electron effective mass in GaInNAs/GaAs quantum-well structures with low nitrogen concentration", *Applied Physics Letters*, Apr. 9, 2001, pp. 2217-2219, vol. 78, No. 15.

Ferry, D.K., et al., "Transport in Nanostructures", *Cambridge University Press*, Hardcover, Jan. 1, 1997, pp. 41-45 and 91-96.

Givargizov, E., "Growth of Whiskers by the Vapor-Liquid-Solid Mechanism", *Current Tonics in Material Science*, edited by E. Kaldis, Jan. 1, 1978, pp. 79-145, Chapter 3, vol. 1.

Mullins, J., "News analysis: using unusable frequencies", IEEE Spectrum, Jul. 1, 2002, pp. 22-23, vol. 39, No. 7.

Randall, J.N., et al., "Quantum Dot Devices", in Norman G. Einsgruch and William R. Frensley, eds., Heterostructures and Quantum Devices (San Diego, CA: Academic Pres, Inc., 1994) Copyright 1994, p. 420.

Markowitz, P.D., et al., "Phase Separation in $Al_xGa_{1-x}As$ Nanowhiskers Grown by the Solution-Liquid-Solid Mechanism", *J. Am. Chem. Soc.*, Apr. 18, 2001, pp. 4502-4511, vol. 123.

Hickmott, T.W., et al., "Negative Charge, Barrier Heights, and the Conduction-Ban Discontinuity in $Al_xGa_{1-x}As$ Capacitors" *Journal of Applied Physics*, Apr. 15, 1985, pp. 2844-2853, vol. 57.

Matthews, J., et al., "Defects in Epitaxial Multilayers", *Journal of Crystal Growth*, Jan. 1, 1974, pp. 118-125, vol. 27.

Kovtyukhova, N., et al., "Layer-by-Layer Assembly Rectifying Junctions in and on Metal Nanowires", *Journal of Physical Chemistry B*, Aug. 14, 2001, pp. 8762-8769, vol. 105.

Sakaki, H., "Scattering Suppression and High-Mobility Effect of Size-Quantized Electrons in Ultrafine Semiconductor Wire Structures", *Japanese Journal of Applied Physics*, Dec. 1, 1980, pp. L735-L738, vol. 19, No. 12.

Scheibel, H., et al., "Generation of Monodisperse Ag- and NaCl Aerosols With Particle Diameters Between 2 and 300 nm", *Journal of Aerosol Science*, Jan. 1, 1983, pp. 113-126, vol. 14, No. 2.

Knutson, E., et al., "Aerosol Classification by Electric Mobility: Apparatus, Theory, and Applications", *Journal of Aerosol Science*, Jan. 1, 1975, pp. 443-451, vol. 6.

Miller, M., et al., "Serpentine Superlattice: Concept and First Results", *Journal of Crystal Growth*, Jan. 1, 1991, pp. 323-327, vol. 111.

Bhat, R., et al., "Patterned Quantum Well Heterostructures Grown by OMCVD on Non-Planar Substrates: Applications to Extremely Narrow SQW Lasers", *Journal of Crystal Growth*, Jan. 1, 1988, pp. 850-856. vol. 93.

Hara, S., et al., "Formation and Photoidnescence Characterization of Quantum Well Wires Using Multiatdc Steps Grown by Metalorganic Vapor Phase Epitaxy", *Journal of Crystal Growth*, Jan. 1, 1994, pp. 692-697, vol. 145.

Givargizov, E.I., "Fundamental Aspects of VLS Growth", *Journal of Crystal Growth*, Jan. 1, 1975, pp. 20-30, vol. 31.

Derycke, V., et al., "Carbon Nonotube Inter- and Intramolecular Logic Gates", *Nano Letters*, Aug. 26, 2001, pp. 453-456, vol. 1, No. 9.

Iljima, S., "Helical microtubules of graphitic carbon", *Nature*, Nov. 7, 1991, pp. 56-58, vol. 354.

Yao, Z., et al., "Carbon Nanotube Intramolecular Junctions", *Nature*, Nov. 18, 1999, pp. 273-276, vol. 402.

Bennett, C., et al., "Quantum information and computation", *Nature*, Mar. 16, 2000, pp. 247-255, vol. 404.

Michler, P. et al., "Quantum correlation among photons from a single quantum dot at room temperature", *Nature*, Aug. 31, 2000, pp. 968-970, vol. 406, No. 6799.

Chow, E., et al., "Three-dimensional control of light in a two-dimensional photonic crystal slab", *Nature*, Oct. 26, 2000, pp. 983-986, vol. 407.

Venkatasubramanian, R., et al., "Thin-Film Thermoelectric Devices with High Room-Temperature Figures of Merit", *Nature*, Oct. 11, 2003, pp. 597-602, vol. 413.

Bachtold, A., et al., "Scanned probe microscopy of electronic transport in carbon nanotubes", *Phys. Rev. Lett.*, Jun. 26, 2000, pp. 6082-6085, vol. 84, No. 28.

Hicks, L.D., et al., "Thermoelectric Figure of Merit of a One-Dimensional Conductor", *Physical Review B*, Jun. 15, 1993, pp. 16631-16634, vol. 47, No. 24.

Itskevich, I.E., et al., "Resonant magnetotunneling through individual self-assembled InAs quantum dots", *Physical Review B*, Dec. 15, 1996, pp. 16401-16404. vol. 54, No. 23.

Reed, M.A., et al., "Observation of Discrete Electronic States in a Zero-Dimensional Semiconductor Nanostructure", *Physical Review Letters*, Feb. 8, 1988, pp. 535-537, vol. 60, No. 6.

Kapon, E., et al., "Stimulated Emission in Semiconductor Quantum Wire Heterostructures", *Physical Review Letters*, Jul. 24, 1989, pp. 430-433, vol. 63, No. 4.

Santori, C., et al., "Triggered Single Photons from a Quantum Dot", *Physical Review Letters*, Feb. 19, 2001, pp. 1502-1505, vol. 86, No. 8.

Capasso. F., et al., "Quantum Cascade Lasers", *Physics Today*, May 1, 2002, pp. 34-40.

Likharev, K.K., "Single-Electron Devices and their Applications", *Proceedings of the IEEE*, Apr. 1, 1999, pp. 606-632, vol. 87, No. 4.

Han, W., et al., "Synthesis of Gallium Nitride Nanorods Throuah a Carbon Nanotube-Confined Reaction", *Science*, Aug. 29, 1997, pp. 1287-1289, vol. 277.

Zhang, Y., et al., "Heterostructures of Single-Walled Carbon Nanotubes and Carbide Nanorods", *Science*, Sep. 10, 1999, pp. 1719-1722, vol. 285.

Holmes, J., et al., "Control of Thickness and Orientation of Solution-Grown Silicon Nanowires", *Science*, Feb. 25, 2000, pp. 1471-1473, vol. 287.

Zhou, C.W., et al., "Modulated Chemical doping of individual carbon nanotubes", *Science*, Nov. 24, 2000, pp. 1552-1555, vol. 290.

Favier, F., et al., "Hydrogen Sensors and Switches from Electrodeposited Palladium Mesowire Arrays", *Science*, Sep. 21, 2001, pp. 2227-2231, vol. 293.

Bachtold, A., et al., "Logic circuits with carbon nanotube transistors", *Science*, Nov. 9, 2001, pp. 1317-1320, vol. 294.

Nicewarner-Pena, S.R., et al., "Submicrometer metallic barcodes", *Science*, Oct. 5, 2001, pp. 137-141, vol. 294.

Service, R.F., "Nanowire Fabricators Earn Their Stripes", *Science*, Jan. 1, 2002, pp. 946-947, vol. 295, No. 5557.

Awschalom, D.D. et al., "Spintronics", *Scientific American*, Jun. 1, 2002, pp. 66-73, vol. 286, No. 6.

Henning, P., et al., "Compositional information from amorphous Si—Ge multilayers using high-resolution electron microscopy imaging and direct digital recording", Ultramicroscopy, Jan. 1, 1996, pp. 221-235, vol. 66.

Wagner, R.S., "VLS Mechanism of Crystal Growth", *Whisker Technology. A.P. Levitt. ed.*, Chapter 3, Jan. 1, 1970, pp. 47-119.

Alferov, Z., et al., "For developing semiconductor heterostructures used in high-speed-and opto-electronics", Nov. 23, 2000, www.nobel.se.physics/laureates/2000/.

Von Klitzing, K., "For the discovery of the quantized Hall effect", Jun. 16, 2000, www.nobel.se/physics/laureates/1985/.

Laughlin, R.B., et al., "For their discovery of a new form of quantum fluid with frictionally charged excitations", Jun. 16, 2000, www.nobel.se/physics/laureates/1998/.

Oda, Y., et al., "Natural Formation of Square Scale Structures on Patterned Vicinal Substrates by MOVPE: Application to the Fabrication of Quantum Structures", *Phys. Conf. Ser.*, No. 166, Chapter 4, Aug. 22-26, 1999, pp. 191-194.

Hayakawa, K., et al., "AlGaAs Nano-Meter Scale Network Structures Fabricated by Selective Area MOVPE", *Phys. Conf. Ser.*, No. 162, Chapter 8, Oct. 12-18, 1998.

Akabori, M., et al., "Selective Area MOVPE Growth of Two-Dimensional Photonic Crystals Having an Air-Hole Array and its Application to Air-Bridge-Type structure", *Physics E*, No. 13, Jan. 1, 2002, pp. 446-450.

Melechko, A.V., et al., "Large-Scale Synthesis of Arrays of High-Aspect-Ratio Rigid Vertically Aligned Carbon Nanofibres", *Nanotechnology*, No. 14, Aug. 19, 2003, pp. 1029-1035.

Kempa, K., et al., "Photonic Crystals Based on Periodic Arrays of Aligned Carbon Nanotubes", *Nano Letters*, Nov. 19, 2002, pp. 13-18, vol. 3, No. 1.

Takahashi, H., et al., "Formation and Characteristics of 100 nm Scale GaAs Quantum Wires by Selective Area MOVPE", *Applied Surface Science*, No. 216, Jan. 1, 2003, pp. 402-406.

Akabori, M., et al., "InGaAs Nano-Pillar Array Formation on Partially Masked InP(111)B by Selective Area Metal-Organic Vapour Phase Egitaxial Growth for Two-Dimensional Photonic Crystal Application", *Nanotechnology*, No. 14, Aug. 27, 2003, pp. 1071-1074.

Kamins, T.I., et al., "Self-Assembled Silicon Nanowires for Integrating Microsystems, Nanoelectronics and Microelectronics", *mstnews*, Mar. 1, 2003.

Wu, Y., et al., "Rational Synthesis of Inorganic Nanowires", *Abstracts of Papers in the Amer. Chem. Soc.*, Apr. 1, 2001, pp. 108—Iec Part 1, vol. 221.

Yang, P., et al., "Nanowires from Vapor Condensation and their Assemblies", *Abstracts of Papers in the Amer. Chem. Soc.*, Mar. 26, 2000, pp. 269—Inor Part 1, vol. 219.

Huang, M., et al., "Nanowire Array as Potential 2-d Photonic Bandgap Materials", *Abstracts of Paners in the Amer. Chem. Soc.*, Apr. 1, 2001, pp. 95—Phys Part 2, vol. 221.

Yang, P., et al., "Inorganic Nanowires: Rational Synthesis, Functional Assemblies and Novel Properties", *Abstracts of Papers in the Amer. Chem. Soc.*, Apr. 7, 2002, pp. 343—Inor Part 2, vol. 223.

Gates, B., et al., "Synthesis and Characterization of Crystalline Ag2Se Nanowires through a Template-Engaged Reaction at Room Temperature", *Advanced Fun, Materials*, Oct. 1, 2002, pp. 679-686, vol. 12, No. 10.

Yang, P., et al., "Controlled Growth of ZnO Nanowires and their Optical Properties", *Advanced Functional Materials*, May 2002, pp. 323-331, vol. 12, No. 5.

Wu, Y., et al., "Superconducting MgB2 Nanowires", *Advanced Materials*, Oct. 2, 2001, pp. 1487-1489, vol. 13, No. 19.

Huang, M., et al., "Catalytic Growth of Zinc Oxide Nanowires by Vapor Transport", Advanced Materials, Jan. 16, 2001, pp. 113-116, vol. 13, No. 2.

Wu, Y., et al., "Melting and Welding Semiconductor Nanowires in Nanotubes", *Advanced Materials*, Apr. 4, 2001, pp. 520-523, vol. 13, No. 7.

Zheng, B., et al., "Synthesis of Ultra-Long and Highly Oriented Silicon Oxide Nanowires from Liquid Alloys", *Advanced Materials*, Jan. 16, 2002, pp. 122-124, vol. 14, No. 2.

Kind, H., et al., "Nanowire Ultraviolet Photodetectors and Optical Switches", *Advanced Materials*, Jan. 16, 2002, pp. 158-160, vol. 14, No. 2.

Xia, Y., et al., "Chemistry and Physics of Nanowires", *Advanced Materials*, Mar. 4, 2003, pp. 351-352, vol. 15, No. 5.

Xia, Y., et al., "One-Dimensional Nanostructures: Synthesis, Characterization, and Applications", *Advanced Materials*, Mar. 4, 2003, pp. 353-389, vol. 15, No. 5.

Yan, H., et al., Morphogensis of One-Dimensional ZnO Nano- and Microcrystaism, *Advanced Materials*, Mar. 4, 2003, pp. 402-405, vol. 15, No. 5.

Wu, Y., et al., "Germanium/Carbon Core-Sheath Nanostructures", *Applied Physics Letters*, Jul. 3, 2000, pp. 43-45, vol. 77, No. 1.

Wu, Y., et al., "Inorganic Semiconductor Nanowires: Rational Growth, Assembly, and Novel Properties", *Chemistry—A European Journal*, Mar. 15, 2002, pp. 1261-1268, vol. 8, No. 6.

Yang, P., et al., "Langmuir-Blodgett Assembly of One-Dimensional Nanostructures", *Chemphyschem*, Jun. 17, 2002, pp. 503-506, vol. 3, No. 6.

Wu, Y., et al., "Direct Observation of Vapor-Liquid-Solid Nanowire Growth", *J. Am. Chem. Soc.*, Mar. 13, 2001, pp. 3165-3166, vol. 123.

Yan, H., et al., "Dendritic Nanowire Ultraviolet Laser Array", *J. Am. Chem. Soc.*, Mar. 29, 2003, pp. 4728-4729, vol. 125, No. 16.

Johnson, J., et al., "Single Nanowire Lasers", *Journal of Physical Chemistry B*, Oct. 23, 2001, pp. 11387-11390, vol. 105, No. 46.

Messer, B., et al., "Microchannel Networks for Nanowire Patterning", *Journal of the Amer. Chem. Soc.*, Sep. 29, 2000, pp. 10232-10233, vol. 122, No. 41.

Song, J., et al., "MMo$_3$Se$_3$ (M=Li+,Na+, Rb+,Cs+, NMe4+) Nanowire Formation via Cation Exchange in Organic Solution", *Journal of the Amer. Chem. Soc.*, Mar. 10, 2001, pp. 9714-9715, vol. 123, No. 39.

Li, Y., et al, "Bismuth Nanotubes: A Rational Low-Temperature Synthetic Route", Journal of the Amer. Chem. Soc., Sep. 14, 2001, pp. 9904-9905, vol. 123, No. 40.

Song, J., et al., "Metal Nanowire Formation Using Mo$_3$Se$_3$—as Reducing and Sacrificing Templates", Journal of the Amer. Chem. Soc., Sep. 26, 2001, pp. 10397-10398, vol. 123, No. 42.

Gates, B., et al., "Single-Crystalline Nanowires of Ag2Se Can Be Synthesized by Templating Against Nanowires of Trigonal Se", *Journal of the Amer. Chem. Soc.*, Oct. 25, 2001, pp. 11500-11501, vol. 123, No. 46.

Wu, Y., et al., "Block-by-Block Growth of Single-Crystalline Si/SiGe Superlattice Nanowires", *Nano Letters*, Jan. 19, 2002, pp. 83-86, vol. 2, No. 2.

Johnson, J., et al., "Near-Field Imaging of Nonlinear Optical Mixing in Single Zinc Oxide Nanowires", *Nano Letters*, Apr. 1, 2002, pp. 279-283, vol. 2, No. 4.

Johnson, J., et al., "Single Gallium Nitride Nanowire Lasers", *Nature Materials*, Sep. 15, 2002, pp. 106-110, vol. 1, No. 2.

Huang, M.H., et al., "Room-Temperature Ultraviolet Nanowire Nanolasers", *Science*, Jun. 8, 2001, pp. 1897-1899.

Wu, Y., et al., "Germanium Nanowire Growth via Sample Vapor Transport", *Chem. Mater*, Mar. 20, 2000, pp. 605-607, vol. 12.

Wu, Y., et al., "Semiconductor Nanowire Array: Potential Substrates for Photocatalysis and Photovoltaics", *Topics in Catalysis*, Apr. 1, 2002, pp. 197-202, vol. 19, No. 2.

Hiruma, K., et al., "GaAs free-standing quantum-size wires", *Journal of Applied Physics*, Sep. 1, 1993, pp. 3162-3171, vol. 74.

Liu J.L., et al., "Gas-source MBE growth of freestanding Si nanowires on Au/S1 substrate", *Superlattices Microstructures*, 1999, pp. 477-479, vol. 25, No. 1-2.

Shimada, et al., "Size, position and direction control on GaAs and InAs nanowhisker growth", *Superlattices and Microstructures*, Dec. 1998, pp. 453-458, vol. 24, No. 6.

Shirai, M., et al., "Gold cluster formation using an atomic force microscope and its applications to GaAs whisker growth" *Superlattices and Microstructures*, Aug. 1998, pp. 157-162, vol. 24, No. 2.

Hiruma, K., et al., "Gas and InAs Nanowire Growth Technology", *Proceedings of the Science and Technology of Atomically Engineered Materials*, Oct. 30, 1995, pp. 563-570.

Westwater, J., et al., "Control of the size and position of silicon nanowires grown via the vapor-liquid-solid technique", *Japanese Journal of Applied Physics*, Part 1, Oct. 1997, pp. 6204-6209, vol. 38.

O'Regan, et al., "A Low-Cost, High-Efficiency Solar Cell Based on Dye-Sensitized Colloidal TiOa Films", *Nature*, Oct. 24, 1991, pp. 737-740, vol. 353.

Jun, et al., "Architectural Control of Magnetic Semiconductor Nanocrystals", *J. Am. Checm Soc.*, Jan. 4, 2002, pp. 615-619, vol. 124, No. 4.

Manna, et al., "Synthesis of Soluble and Processable Rod-, Arrow-, Teardrop-, and Tetrapod-Shaped CdSe Nanocrystals", *J. Am. Chec. Soc.*, Dec. 1, 2000, pp. 12700-12706, vol. 122, No. 51.

Huang, et al., "Directed Assembly of one-dimensional nanostructures into functional networks", *Science*, Jan. 26, 2001, pp. 630-633, vol. 291.

Persson, "Heterointerfaces in III-V semiconductor nanowhiskers", *IEEE*, 2002, pp. 281-283.

Gao, et al., "Self-Assembled Nanowire-Nanoribbon Junction Arrays of ZnO", *The Journal of Physical Chemistry*, Nov. 12, 2002, pp. 12653-12658, vol. 106, No. 49.

Jun, et al., "Controlled Synthesis of Multi-Armed CdS Nanorod Architectures Using Monosurfactant System", *J. Am. Chem. Soc.*, May 5, 2001, pp. 5150-5151, vol. 123.

Poole, et al., "Spatially Controlled, Nanoparticle-Free Growth of InP Nanowires", *Applied Physics Letters*, Sep. 8, 2002, pp. 2055-2057, vol. 83, No. 10.

Hiruma et al., "Quantum Size Microcrystals Grown Using Organametallic Vapor Phase Epitaxy", *Appl. Phys. Lett.*, vol. 59, No. 4, Jul. 22, 1991, pp. 431-433.

Ozaki et al., "Silicon Nanowhiskers Grown on a Hydrogen-Terminated Silicon (111) Surface", *Applied Physics Letters*, vol. 73, No. 25, Dec. 21, 1998, pp. 3700-3702.

Wu et al., "Growth, Branching, and Kinking of Molecular-Beam Epitaxial <110> GaAs Nanowires", *Applied Physics Letters*, vol. 83, No. 16, Oct. 20, 2003, pp. 3368-3370.

Grätzel, "Photoelectrochemical Cells", *Nature*, vol. 414, Nov. 15, 2001, pp. 338-344.

Wang et al., "Nanocrystals Branch Out", *Nature Materials*, vol. 2, Jun. 2003, pp. 385-386.

Manna et al., "Controlled Growth of Tetrapod-Branched Inorganic Nanocrystals", *Nature Materials*, vol. 2, Jun. 2003, pp. 382-385.

Wang et al., "Rational Growth of Branched and Hyperbranched Nanowire Structures", *Nano Letters*, vol. 4, No. 5, Mar. 31, 2004.

Dick et al., "Synthesis of Branched 'Nanotrees' by Controlling Seeding of Multiple Branching Events", *Nature Materials*, vol. 3, May 2, 2004.

Oda et al., "Natural Formation of Square Scale Structures on Patterned Vicinal Substrates by MOVPE: Application to the Fabrication of Quantum Structures", *Inst. Phys. Conf. Ser.*, No. 166, Chapter 4, Aug. 22, 1999, pp. 191-194.

Akabori et al., "Selective Area MOVPE Growth of Two-Dimensional Photonic Crystals Having an Air-Hole Array and its Application to Air-Bridge-Type Structures", *Physica E*, No. 13, 2002, pp. 446-450.

Melechko et al., "Large-Scale Synthesis of Arrays of High-Aspect-Ratio Ridig Vertically Aligned Carbon Nanofibres", *Nanotechnology*, No. 14, Aug. 19, 2003, pp. 1029-1035.

Wu et al., "Single-Crystal Metallic Nanowires and Metal/Semiconductor Nanowire Heterostructures", *Nature*, vol. 430, Jul. 1, 2004, pp. 61-65.

Zhong et al., "Nanowire Crossbar Arrays as Address Decoders for Integrated Nanosystems" *Science*, vol. 302, Nov. 21, 2003, pp. 1377-1379.

McAlpine et al., "High-Performance Nanowire Electronics and Photonics on Glass and Plastic Substrates", *Nano Letters*, vol. 3, No. 11, Oct. 14, 2003, pp. 1531-1535.

Greytak et al., "Growth and Transport Properties of Complementary Germanium Nanowire Field-Effect Transistors" *Applied Physics Letters*, vol. 84, No. 21, May 24, 2004, pp. 4176-4178.

Whang et al., "Large-Scale Hierarchical Organization of Nanowire Arrays for Integrated Nanosystems", *Nano Letters*, vol. 3, No. 9, Aug. 5, 2003, pp. 1255-1259.

McAlpine et al., "Nanoimprint Lithography for Hybrid Plastic Electronics", *Nano Letters*, vol. 3, No. 4, Mar. 7, 2003, pp. 443-445.

Bozovic et al., "Plastic Deformation in Mechanically Strained Single-Walled Carbon Nanotubes", *Physical Review B*, vol. 57, Jan. 22, 2003, pp.033407-1-033407-4.

Hahm at al., "Direct Ultrasensitive Electrical Detection of DNA and DNA Sequence Variations Using Nanowire Nanosensors", *Nano Letters*, vol. 4, No. 1, Dec. 9, 2003, pp. 51-54.

Lieber, "Nanoscale Science and Technology: Building a Big Future from Small Things", MRS Bulletin, Jul. 2003, pp. 486-491.

Yu et al., "Silicon Nanowires: Preparation, Device Fabrication, and Transport Properties", *J. Phys. Chem. B.*, vol. 104, No. 50, Nov. 23, 2000, pp. 11864-11870.

Law et al., "Photochemical Sensing of $NO_2$ with $SnO_2$ Nanoribbon Nanosensors at Room Temperature", *Angew. Chem. Int. Ed.*, vol. 41, No. 13, 2002, pp. 2405-2408.

Lao et al., "Hierarchical ZnO Nanostructures", *Nano Letters*, vol. 2, Sep. 13, 2002, pp. 1287-1291.

Barrelet et al., "Synthesis of CdS and ZnS Nanowires Using Single-Source Molecular Precursors", *J. Am. Chem. Soc.*, vol. 125, 2003, pp. 11498-11499.

Björk et al., "Few-Electron Quantum Dots in Nanowires", *Nano Letters*, vol. 4, No. 9, Jul. 28, 2004, pp. 1621-1625.

Martensson et al., "Nanowire Arrays Defined by Nanoimprint Lithography", *Nano Letters*, vol. 4, Mar. 17, 2004, pp. 699-702.

Hornstra, "Dislocations in the Diamond Lattice", *J. Phys. Checm. Solids*, vol. 5, 1958, pp. 129-141.

Krost et al., "InP on Si(111): Accommodation of Lattice Mismatch and Structural Properties", *Appl. Phys. Lett.*, vol. 64, No. 7, Feb. 7, 1994, pp. 769-771.

Gorbach et al., "Growth of III-V Semiconductor Layers on Si Patterned Substrates", *Thin Solid Films*, vol. 336, 1998, pp. 63-68.

Ohlsson et al., "Anti-Domain-Free GaP, Grown in Atomically Flat (001) Si Sub-μm-sized Openings", *Applied Physics Letters*, vol. 80, No. 24, Jun. 17, 2002, pp. 4546-4548.

Kawanami, "Heteroepitaxial Technologies of III-V on Si", *Solar Energy Materials & Solar Cells*, vol. 66, 2001, pp. 479-486.

Westwater et al., "Growth of Silicon Nanowires Via Gold/Silane Vapor-Liquid-Solid Reaction", *J. Vac. Scl. Technol. B.*, vol. 15, No. 3, 1997, pp. 554-557.

Kamins et al., "Ti-Catalyzed Si Nanowjres by Chemical Vapor Deposition: Microscopy and Growth Mechanisms", *Journal of Applied Physics*, vol. 89, No. 2, Jan. 15, 2001, pp. 1008-1016.

Schubert et al., "Silicon Nanowhiskers Grown on <111> Si Substrates by Molecular-Bean Epitaxy,"*Applied Physics Letters*, vol. 84, No. 24, Jun. 14, 2004, pp. 4968-4970.

Kamins et al., "Growth and Structure of Chemically Vapor Deposited Ge Nanowires on Si Substrates", *Nano Letters*, vol. 4, No. 3, Jan. 23, 2004, pp. 503-506.

Thornton et al., "A Photoemission Study of Passivated Silicon Surfaces Produced by Etching in Solutions of HF", *Semicond. Sci. Technol.*, vol. 4, 1989, pp. 847-851.

Borgstrom et al., "Size- and Shape-Controlled GaAs Nano-Whiskers Grown by MOVPE: A Growth Study", *Journal of Crystal Growth*, vol. 260, 2004, pp. 18-22.

Westwater et al., "Si Nanowires Grown Via the Vapour-Liquid-Solid Reaction", *Phys. Stat. Sol.*, vol. (a)165, 1998, pp. 37-42.

Westwater et al., "The Characteristics and Oxidation of Vapor-Liquid-Solid Grown Si Nanowires", *Mat. Res. Soc. Symp. Proc.*, vol. 452, 1997, pp. 237-242.

Westwater et al., "Nanoscale Silicon Whiskers Formed by Silane/Gold Reaction at 335° C", *Materials Letters*, vol. 24, Jun. 1995, pp. 109-112.

Yang, "Semiconductor Nanowire Array", *Proceedings of the SPIE*, vol. 4806, 2002, pp. 222-224.

Kuykendall et al., "Crystallographic Alignment of High-Density Gallium Nitride Nanowire Arrays", *Nature Materials*, vol. 3, Jul. 25, 2004, pp. 524-528.

Abramson et al., "Fabrication and Characterization of a Nanowire/Polymer-Based Nanocomposite for a Prototype Thermoelectric Device", *Journal of Microelectromechanical Systems*, vol. 13, No. 3, Jun. 2004, pp. 505-513.

Abramson et al., "Nanowire Composite Thermoelectric Devices", Proceedings of IMECE2002, *ASME Internationa Mechanical Engineering Congress & Exposition*, Nov. 17-22, 2002, pp. 7-11.

Johnson et al., "Single Nanowire Waveguides and Lasers", *Proceedings of SPIE*, vol. 5223, 2003, pp. 187-196.

Greene et al., "Low-Temperature Wafer-Scale Production of ZnO Nanowire Arrays", *Angew. Chem. Int. Ed.*, vol. 42, 2003, pp. 3031-3034.

Kim et al., "Nanowire Arrays for Thermoelectric Devices", Proceedings of HT2003, *ASME Summer Heat Transfer Conference*, Jul. 21-23, 2003, pp. 101-104.

Choi et al., "Self-Organized GaN Quantum Wire UV Lasers", *J. Phys. Chem. B.*, vol. 107, 2003, pp. 8721-8725.

Yang, "From Nanowire Lasers to Quantum Wire Lasers", *Proceedings of SPIE*, vol. 5349, 2004, pp. 18-23.

Mikkelsen et al., "Direct Imaging of the Atomic Structure Inside a Nanowire by Scanning Tunneling Microscopy", *Nature Materials*, vol. 3, Jul. 4, 2004, pp. 519-523.

Thelander et al., "Electron Transport in InAs Nanowires and Heterostructure Nanowire Devices", *Solid State Communications*, vol. 131, Jun. 11, 2004, pp. 573-579.

Samuelson et al., "Semiconductor Nanowires for Novel One-Dimensional Devices", *Physica E*, vol. 21, 2004, pp. 560-567.

Shorubalko et al., "Tunable Nonlinear Current-Voltage Characteristics of Three-Terminal Ballistic Nanojunctions", *Applied Physics Letters*, vol. 83, No. 12, Sep. 22, 2003, pp. 2369-2371.

Samuelson et al., "Fabrication and Spectroscopic Studies of InP/GaInAs/Inp and GaAs/GaInAs/GaAs Quantum-Well Wire Structures", *Inst. Phys. Confer. Ser.* No. 127, Chapter 3, Jan. 1, 1992, pp. 95-98.

Samuelson et al., "Fabrication and Imaging of Quantum Well Wire Structures", *SPIE*, vol. 1676, 1992, pp. 154-160.

Larsson et al., "Probing of Individual Semiconductor Nanowhiskers by TEM-STM", *Microscopy and Microanalysis*, vol. 10, 2004, pp. 41-46.

Ramvall et al., Quantized Conductance in a Heterostructurally Defined $Ga_{0-25}In_{0-75}As/InP$, *Appl. Phys. Lett.*, vol. 71, Aug. 18, 1997, pp. 918-920.

Ng et al., "Growth of Epitaxial Nanowires at the Junctions of Nanowalls", *Science*, vol. 300, May 23, 2003, p. 12.

Ng et al., "Epitaxial Single Crystalline Inorganic Nanowires and Nanowalls: Growth Morphogenesis and Applications in Nano-Optoelectronics", *Proceedings of SPIE*, vol. 5349, 2004, pp. 11-17.

Ng et al., "Three Dimensional Columnar Optical Nanostructures Fabricated by Using Lithography-Free Templating Approach", *Applied Physics Letters*, vol. 84, No. 15, Apr. 12, 2004, pp. 2898-2900.

Thelander et al., "One Dimensional Heterostructures and Resonant Tunneling in III-V Nanowires", *IEEE International Symposium on Compound Semiconductors*, Aug. 25, 2003, pp. 151-152.

Björk et al., "Heterostructures in One-Dimensional Nanowires", *Proceedings of 7th International Conference of Nanometer-Scale Science and Technology and 21st European Conference on Surface Science*, Jun. 24, 2002.

Ohlsson et al., "Comparison Between (111)B and (100)III-V Nanowhiskers", Proceedings of 7th International Conference of Nanometer-Scale Science and Technology and 21st European Conference on Surface Science, Jun. 24, 2002.

Larsson et al, In-Situ Manipulations and Electrical Measurements of III-V Nanowhiskers with TEM-STM, Proceedings of 7th International Conference of Nanometer-Scale Science and Technology and 21st European Conference on Surface Science, Jun. 24, 2002.

Persson et al., "Solid-phase-diffusion mechanism for GaAs nanowire growth", *Nature Materials*, vol. 3, Oct. 2004, pp. 677-681.

Ng et al., "Single Crystal Nanowire Vertical Surround-Gate-Field-Effect Transistor", *Nano Letters*, vol. 4, No. 7, May 29, 2004, pp. 1247-1252.

Lieber et al., "Nanowires as Building Blocks for Nanoelectronics and Nanophotonics", *Electron Devices Meeting 2003 IEEE International*, 2003, pp. 12.3.1-12.3.3.

Martensson et al., "Epitaxial-III-V Nanowires on Silicon", *Nano Letters*, vol. 4, No. 10, Sep. 23, 2004, pp. 1987-1990.

Jensen et al., "Role of Surface Diffusion in Chemical Beam Epitaxy of InAs Nanowires", *Nano Letters*, vol.4, No. 10, Sep. 14, 2004, pp. 1961-1964.

Bindal et al., "The impact of silicon nano-wire technology on the design of single-work-function CMOS transistors and circuits," Nanotechnology, 2006, 17:4340-4351.

Bryllert et al., "Vertical wrap-gated nanowire transistors," Nanotechnology, 2006, 17:S227-S230.

International Search Report and Written Opinion dated Apr. 25, 2008, in PCT/SE2008/050036, 12 pages.

Bertness et al., "Catalyst-Free Growth of GaN Nanowires," Journal of Electronic Materials, 2006, 35(4):576-580.

Dailey et al., "Vapor-liquid-solid growth of germanium nanostructures on silicon," Journal of Applied Physics, Dec. 15, 2004, 96(12):7556-7567.

Hersee et al., "The Controlled Growth of GaN Nanowires," Nano Letters, 2006, 6(8):1808-1811.

Kipshidze et al., "Controlled growth of GaN nanowires by pulsed metalorganic chemical vapor deposition," Applied Physics Letters, 2005, 86:033104-1 to 033104-3.

Ma et al., "Small-Diameter Silicon Nanowire Surfaces," Science, Mar. 21, 2003, 299:1874-1877.

Mohan et al., "Controlled growth of highly uniform, axial/radial direction-defined, individually addressable InP nanowire arrays," Nanotechnology, 2005, 16:2903-2907.

Mohan et al., "Realization of conductive InAs nanotubes based on lattice-mismatched InP/InAs core-shell nanowires," Applied Physics Letters, 2006, 88:013110-1 to 013110-3.

Pan et al., "Single-crystal growth of metallic nanowires with preferred orientation," Nanotechnology, 2005, 16:1559-1564.

Qian et al., "Core/Multishell Nanowire Heterostructures as Multicolor, High-Efficiency Light-Emitting Diodes," Nano Letters, 2005, 5(11):2287-2291.

Supplementary European Search Report issued in European Application No. 07861100.1, mailed Sep. 11, 2012.

\* cited by examiner

NANOELECTRONIC STRUCTURE AND METHOD OF PRODUCING SUCH

The present invention is a continuation of U.S. application Ser. No. 11/812,226, filed Jun. 15, 2007, which is incorporated herein by reference in its entirety.

FIELD OF THE INVENTION

The present invention relates to the methods and structures for controlling access resistance and conductivity characteristics of nanoelement devices.

BACKGROUND OF THE INVENTION

Nanostructures include so-called one-dimensional nanoelements, essentially in one-dimensional form, that are of nanometer dimensions in their width and diameter, and are commonly known as nanowires, nanowhiskers, nanorods, nanotubes, etc. For the purpose of this application the term nanoelement is used. As regards e.g. nanowires and nanowhiskers, the basic process of nanostructure formation on substrates by the so-called VLS (vapor-liquid-solid) mechanism is well known. However, the present invention is limited to neither the nanowires nor the VLS process, e.g. selectively grown nanowires and nanostructures, etched structures, other nanoelements, and structures fabricated from nanowires are also included, although the description is focused on VLS-grown nanowires. Methods for growing nanowires on semiconductor substrates are described in U.S. Published Applications 2003/010244 and 2004/0075464.

Semiconductor nanoelement devices show great promise, potentially outperforming standard electrical, opto-electrical, and sensor- etc. semiconductor devices. These devices can utilize certain nanoelement specific properties, 2D, 1D, or 0D quantum confinement, flexibility in axial material variation due to less lattice match restrictions, antenna properties, ballistic transport, wave guiding properties etc. Furthermore, in order to design first rate semiconductor devices from nanoelements, i.e. transistors, light emitting diodes, semiconductor lasers, and sensors, and to fabricate efficient contacts, particularly with low access resistance, to such devices, the ability to dope and fabricate doped regions is crucial. The general importance of doping is easily exemplified by the basic pn-junction, a structure being a critical part of several device families, where the built in voltage is established by doping of the p and n regions.

As an example the limitations in the commonly used planar technology are related to difficulties in making field effect transistors, FET, with low access resistance, the difficulty to control the threshold voltage in the post-growth process, the presence of short-channel effects as the planar gate length is reduced, and the lack of suitable substrate and lattice-matched heterostructure material for the narrow band gap technologies.

One advantage of a nanoelement FET is the possibility to tailor the band structure along the transport channel using segments of different band gap and or doping levels. This allows for a reduction in both the source-to-gate and gate-to-drain access resistance. These segments may be incorporated directly during the growth, which is not possible in the planar technologies.

The doping of nanoelements is challenged by several factors. Physical incorporation of dopants into the nanoelement crystal may be inhibited, but also the established carrier concentration from a certain dopant concentration may be lowered as compared to the corresponding doped bulk semiconductor. One factor that limits the physical incorporation and solubility of dopants in nanoelements is that the nanoelement growth temperatures very often are moderate. U.S. Pat. No. 25,006,673 teaches a method of providing charge carriers to a nanowhisker from adjacent layers.

For VLS grown nanoelements, the solubility and diffusion of dopant in the catalytic particle will influence the dopant incorporation. One related effect, with similar long term consequences, is the out-diffusion of dopants in the nanoelement to surface sites. Though not limited to VLS grown nanoelements, it is enhanced by the high surface to volume ratio of the nanoelement. Also, the efficiency of the doping—the amount of majority charge carriers established by ionization of donors/acceptor atoms at a certain temperature may be lowered compared to the bulk semiconductor, caused by an increase in donor or acceptor effective activation energy, due to the small dimensions of the nanoelement. Surface depletion effects, decreasing the volume of the carrier reservoir, will also be increased due to the high surface to volume ratio of the nanoelement.

The above described effects are not intended to establish a complete list, and the magnitudes of these effects vary with nanoelement material, dopant, and nanoelement dimensions. They may all be strong enough to severely decrease device performance.

SUMMARY OF THE INVENTION

Prior art semiconductors in small dimensions have drawbacks with regards to access resistance and conductivity characteristics.

The embodiments of the present invention reduce or overcome some or all of the drawbacks of the prior art.

The semiconductor nanoelement device according to the embodiments of the invention comprises at least one semiconductor nanoelement. The semiconductor device is arranged to be electrically connectable. The device comprises a semiconductor volume element with a larger diameter than the nanoelement arranged in epitaxial connection to the nanoelement. The volume element is doped, typically to a high degree, and provides a high charge carrier injection into the nanoelement. Additionally the volume elements facilitate a low access resistance in an electrical connection made to the device.

The nanoelement may further protrude from a semiconductor substrate.

The volume element may be arranged in a wrap around configuration, enclosing an end portion of the nanoelement, on top of the nanoelement or along the nanoelement circumferential surface of the nanoelement.

The nanoelement and volume element may comprise concentric layers being a semiconductor material of different composition or doping as compared to the nanoelement or volume element respectively, a dielectric material or a low resistivity material (i.e., an electrically conductive material), such as a metal or metal alloy.

A low resistivity contact for semiconductor device according to the present invention may be formed by having a volume element concentric layer being a low resistivity material.

Thus, it is possible to provide new and improved nano-engineered structures for semiconductor devices, comprising nanoelements connected in series with volume elements with essentially larger dimensions having improved conductivity characteristics.

It is a further advantage of the embodiments of the invention to provide new and improved nano-engineered structures for semiconductor devices, comprising nanoelements connected in series with volume elements, wherein the structures comprise improved/tailored pn-junctions.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE DRAWINGS

Preferred embodiments of the invention will now be described with reference to the accompanying drawings, wherein.

DETAILED DESCRIPTION OF EMBODIMENTS

Figure 1:
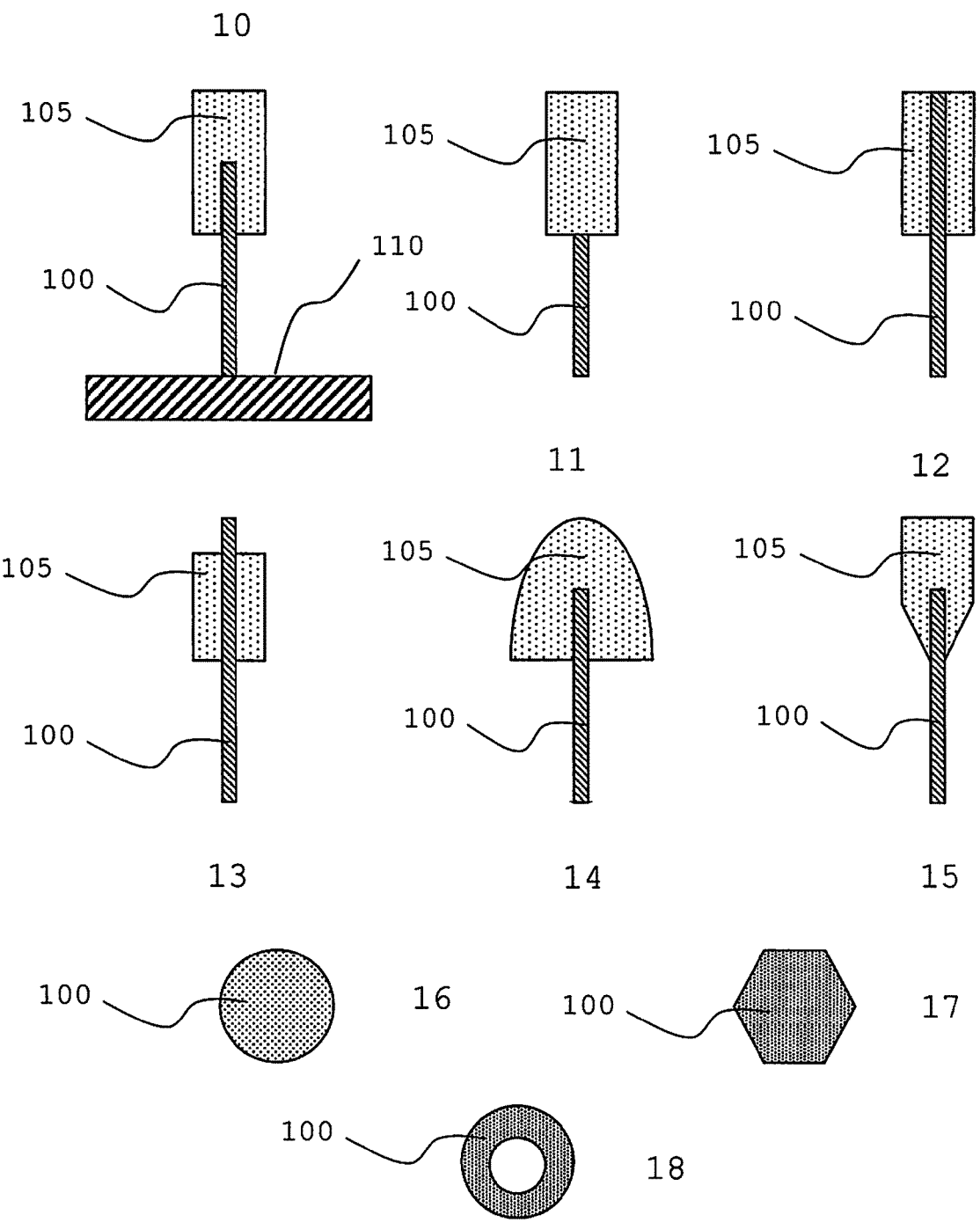
FIG. 1 is a sectional view of different configurations of funnel structures comprising one nanoelement with a volume element on top and three schematic cross sections of the nanoelement.

A semiconductor device according to the embodiments of the present invention opens new possibilities for the implementation of different electronic and photonic semiconductor devices, particularly in small dimensions.

The embodiments of present invention decrease general difficulties associated with doping of nanoelements, and to establish an alternative and feasible route to the doping of nanoelements, not only for when doping is complicated by the dimensions or the fabrication methods of such nanoelements, but also for providing new possibilities by the different prerequisites and for decreasing access resistances to electrical and optical devices made from nanoelements.

While there are certain limitations in semiconductor devices in small dimensions fabricated using planar technology, nanoelement technology, in particular nanowire technology, allows for greater flexibility and greater possibility to tailor the performance by e.g. tailoring the band structure along the nanostructure using segments of different band gap and/or doping levels. Although reasoning about nanoelements hereinafter mainly is referred to the mentioned nanowire technology, in particular VLS grown nanowires, the present invention is, as appreciated by a skilled person, applicable on nanoelement semiconductor devices in general, irrespective of specific kind of nanoelements utilized.

For a majority of nanoelement devices it is important to decrease access resistances in order to increase device efficiency. The nanoelement format in itself is not optimal from this perspective as the elongated nature and low area of the nanoelement cross-section will build device resistance. The main tools of fabricating low resistance contacts, a task complicated by the intrinsically low contact-surfaces given by the nanoelement geometry, are high doping and low band gap adjustment on the semiconductor side of the contact, but as mentioned, the doping of nanoelements is challenged by several factors. The access to sufficient and accurate doping and a large contact surface without appreciably increasing device length and access resistance would be beneficial for all types of semiconductor devices.

However, certain other parts of a nanoelement device are not in need of high doping, or, their doping-level is of less priority and can be balanced against other design parameters. There are also devices where doping of critical parts will decrease device performance. Such examples of contra-productive doping effects are non-emitting impurity levels in an optical region or impurity scattering, decreasing mobility, in a field effect channel.

The embodiments of the present invention provide a nanostructure, a so called funnel structure, comprising an epitaxial structure with at least one essentially one-dimensional nanoelement and at least one element extending in three dimensions, having a large volume and a large surface, hereinafter referred to as a volume element. The challenging doping procedures for nanoelements may be avoided, the processing is simplified and more reliable, the access resistance may be decreased, both due to doping and to an increased contact surface, the advantages of using a nanoelement may be utilized, and new applications and possibilities for nanoelement semiconductor devices open up.

In principle, the funnel structure comprises one nanoelement portion, possibly with all the attractive properties of such an element, and one epitaxially connected wider portion with an inherently large surface, a volume element portion, not necessarily of nanometer dimension adjacent to the nanoelement, where nanoelement properties are of less importance and rather bulk-like properties, enabling the volume element to easily be highly doped, are desired. Nevertheless, the volume element, although not necessarily of nanometer dimension, may have some nanoelement properties, such as the ability to grow a crystalline structure with segments of different composition and without detrimental defects, not possible in using planar technology. In some embodiments, the volume element may be a relatively thick shell that is epitaxially grown only around the one portion of the nanowire. The volume element is preferably sufficiently thick and long such that it has bulk semiconductor like doping characteristics rather than 1D nanowire-like doping characteristics. For example, the nanoelement may have a diameter in the order of 100 nm to 500 nm, and the volume element a diameter in the order of 500 nm to 1000 nm, i.e. a thickness preferably on the order of 150 nm greater, such as about 200 nm.

The funnel structure works as a carrier reservoir enabling high carrier injection into the nanoelement from a region with well defined doping where low resistance contacts easily can be fabricated, preferably in a wrap around configuration in order to increase contact area and minimize distance between the nanoelement and the contact. The three-dimensional part of the funnel has a certain volume and thickness, eliminating the challenges in doping of one-dimensional nanoelements, in order to achieve the necessary doping concentration and profiles, to decrease internal series resistance and contact resistance, increase carrier injection into the nanoelement, to establish desired built-in-voltage, and to provide a large contact surface. The low internal resistance and the increased amount of carriers due to the funnel nature provide a high injection of majority carriers into the nanoelement already at low forward voltages.

An apparent application of the funnel structure is for establishing a low resistance connection to a terminal that needs to be separated from other connected circuitry to decrease capacitance in the circuitry. Low resistance and stable ohmic contacts, and in some cases Schottky contacts, are desired for most semiconductor devices. The funnel structure may advantageously also be used as a light emitting diode or a pin detector (i.e., photodectotor based on a diode, such as p-i-n diode). Moreover the funnel structure may be implemented in a nanoelement FET (field effect transistor) device wherein access resistance is decreased by utilizing funnel structures between drain/gate and/or source/gate. The increased surface area of a nanoelement device, due to a volume element, is not only important as means for reducing the access resistance, but also provides a large contact surface for a dielectric covering the volume element, enabling charge storage in e.g. a memory device. It is well known that the resistance arisen from the heterojunction discontinuity in valence or conduction band between two semiconductors or, similarly, the resistance from the Schottky barrier between a semiconductor and a metal can be decreased by high doping. The increased doping will decrease the width of the barrier and facilitate carriers to tunnel through the barrier effectively decreasing contact resistance.

According to common nomenclature, donor doped material is n-type and acceptor doped material is p-type. The "an" indicates that electrons are charge carriers and consequently the "p" indicates that holes are the charge carriers. The pure and undoped material is called intrinsic, but may naturally be n- or p-type. The conductivity is varied by adding different amount of dopants. A region that is highly doped is in the figures and hereinafter denoted with a "+" sign.

As shown in FIG. 1, the funnel structure of one embodiment comprises a nanoelement 100 and a volume element 105. In the embodiment of FIG. 1, the nanoelement 100 comprises an intrinsic semiconductor (which may naturally be n or p-type as deposited) forming a first elongated cylinder, and the volume element 105 comprises of a heavily doped semiconductor forming a second cylinder or sphere, with a larger diameter, epitaxially grown on one end portion of the nanoelement 100. As illustrated in FIG. 1, the volume element 105 may be in a wrap around configuration where the volume element 105 partly encloses the nanoelement 100 end portion, such as the upper end portion, but does not enclose the lower portion of the nanoelement 100 adjacent to the substrate 110. The funnel structure is commonly upstanding on the surface of a semiconductor substrate 110. The funnel structure may be upstanding at 90 degrees or at a different angle with respect to the substrate 110.

Other configurations of the nanoelement 100 and volume element 105 shape(s) and connection are possible. Some exemplary connections 10, 11, 12, 13, 14, and 15 are shown in FIG. 1. The volume element 105 may be arranged in sequence (10, 11) with the nanoelement 100 or the nanoelement 100 may extend through the volume element 105, either continuing beyond (13) the volume element 105 or ending at the end (12) of the volume element 105. Since different materials and processing may be employed to fabricate the nanoelements, different shapes are possible for the nanoelements. For example, the volume elements 105 can be cylindrical, rounded (mushroom shaped) (14), or slanted (15) at the part enclosing the nanoelement 100. The cross-sections of the nanoelement 100 and the volume element 105s are not necessarily circular (16), but may be polygonal (17), such as hexagonal, due to the crystal structure of the material, or hollow (18).

Figure 2:
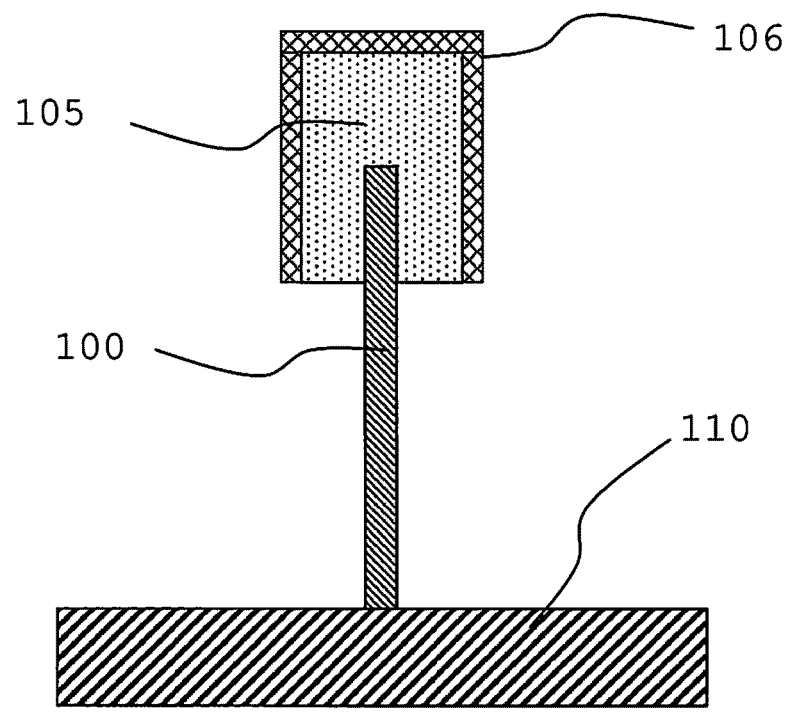
FIG. 2 is a sectional view of a funnel structure with a volume element with a low resistivity contact on the circumferential and top surfaces, arranged in a wrap around configuration on a nanoelement that is upstanding on a semiconductor substrate.

One embodiment of the present invention is funnel structure, as illustrated in FIG. 2, comprising, from the bottom, a nanoelement 100 of a semiconductor that is intrinsically p-type, upstanding on a semiconductor substrate 110 that is p-doped, forming a first elongated cylinder, with a diameter of about 100 nm and a length of about 2 µm, a heavily n-doped volume element 105 forming a second cylinder with an essentially larger diameter, i.e. about 500 nm, and a length of about 750 nm, arranged on top of the nanoelement 100, whereby the volume element 105 encloses the top portion, for example the upper 250 nm, of the nanoelement 100 in a wrapped around configuration, and a low resistance contact formed by a concentric layer 106 covering the top and mantle (side) surface(s) of the volume element 105. More specifically the semiconductor substrate 110 in connection with the nanoelement 100 is p-doped GaAs, the nanoelement 100 is an intrinsically p-type GaAs nanowire, the volume element 105 is n+-doped GaP, and the low resistivity contact 106 is an ITO (InSnO) layer with a thickness of 10 nm. Due to the doped regions, a pn-junction is formed somewhere in the region between the substrate 110 and the volume element 105.

The dimensions given for the nanoelement 100 and volume element 105 in the embodiments are by way of example only, and the length and diameter of the nanoelement and the diameter and height of the volume element 105 may be varied, within certain limits. The length of the nanoelement 100 may be as short as a few epitaxial layers if the purpose of the nanoelement 100 only is to make it feasible to grow a three-dimensional volume element 105 on the substrate. In general the volume element 105 diameter preferably is at least 50 nm wider than the diameter of the nanoelement 100. Moreover the maximum diameter of the volume element 105 is dependent on the device density.

Figure 3:
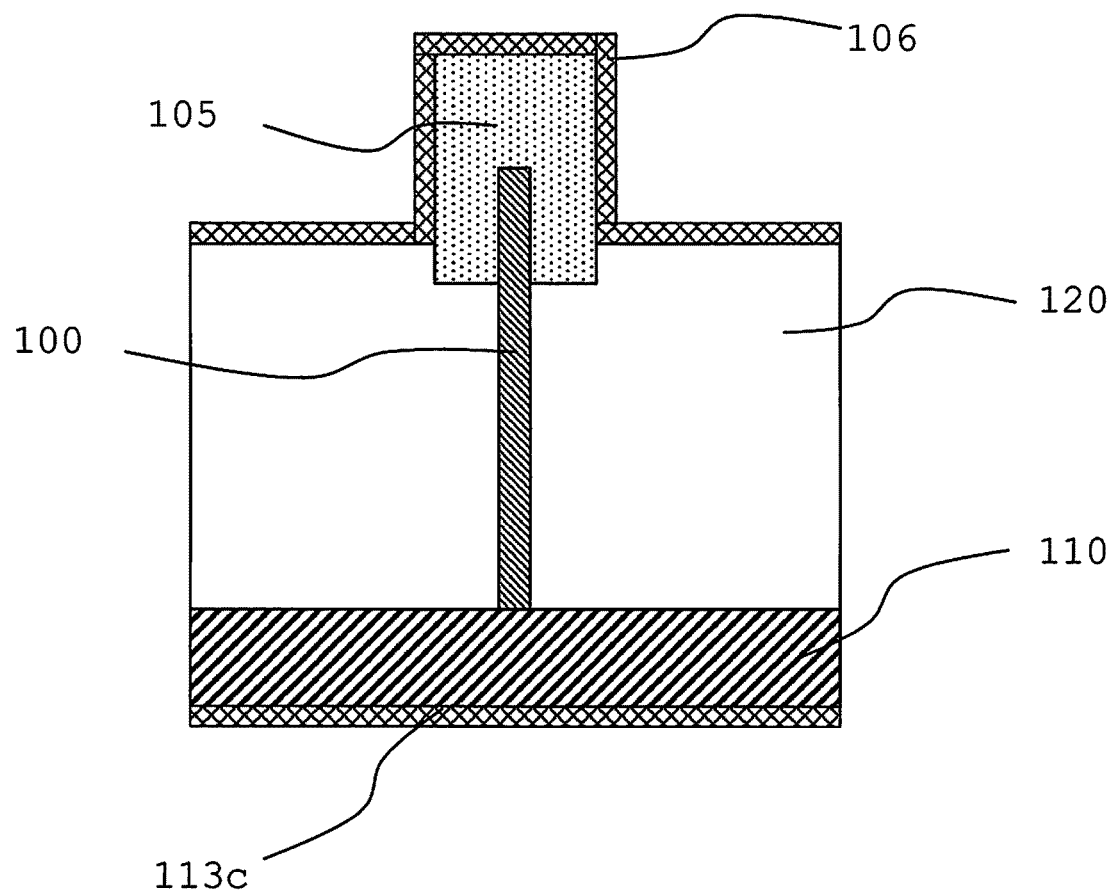
FIG. 3 is a sectional view of a semiconductor device comprising an intrinsic GaAs nanoelement, a p-type GaAs substrate underneath the nanoelement, a heavily n-doped InGaP volume element arranged in a wrap around configuration on the nanoelement, a $SiO_2$ layer surrounding the nanoelement and partly the volume element, and Ti/Au contacts deposited on both sides of the device, whereby a pn-junction is formed in the nanoelement.

Another embodiment, shown in FIG. 3, is a similar funnel structure to the foregoing example, comprising an intrinsic GaAs nanoelement 100, a p-GaAs substrate 110, a n+-InGaP volume element 105, a filler layer 120 of $SiO_2$ (or another suitable insulating material) enclosing the whole nanoelement 100 and partly the volume element 105, and thin film Ti/Au contacts (106, 113) on the top surface of the structure and bottom surface of the substrate 110 respectively.

Figure 4:
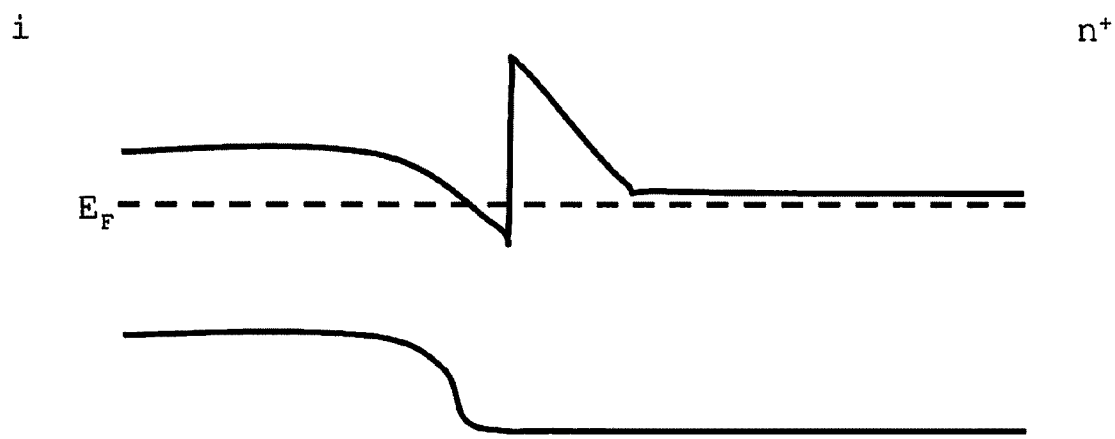
FIG. 4 is a band diagram showing the energy levels in a funnel structure according to FIG. 3, where the band gap of the volume element is larger than for the nanoelement.

The band diagram, schematically illustrated in FIG. 4, of such a funnel structure, shows the pn-junction formed in the nanoelement 100 with the volume element 105 and the substrate 110 respectively as the doped regions. The exact location and extension of the depletion zone is dependent on the doping concentrations and profiles, geometry, etc.

Obviously other embodiments of the present invention with different combinations of materials and of doping types are possible, e.g. a p-type volume element 105 and an n-type one-dimensional nanoelement 100 and substrate 110. Suitable materials for the substrate include, but is not limited to, 110 Si, GaAs, GaP, GaP:Zn, GaAs, InAs, InP, GaN, $Al_2O_3$, SiC, Ge, GaSb, ZnO, InSb, SOI (silicon-on-insulator), CdS, ZnSe, CdTe, etc. Suitable materials for the nanoelements 100 and the volume elements 105 include, bit is not limited to: GaAs (p), InAs, Ge, ZnO, InN, GaInN, GaN AlGaInN, BN, InP, InAsP, GaInP, InGaP:Si, InGaP:Zn, GaInAs, AlInP, GaAlInP, GaAlInAsP, GaInSb, InSb, Si, etc. Possible donor dopants are, but not limited to, for e.g. GaP are Si, Sn, Te, Se, S, etc, and acceptor dopants for the same material are Zn, Fe, Mg, Be, Cd, etc. A person skilled in the art is familiar with these and other materials and realizes that other materials and material combinations are possible. The doping level is dependent on the type of semiconductor. As an example GaAs is intrinsic at $10^{16}$ $cm^{-3}$, hence a typical doping level in the nanoelement 100 is $10^{16}$-$10^{17}$ $cm^{-3}$ and $10^{17}$-$10^{20}$ in the volume element, depending on the dimensions and the conditions in the manufacturing process. However, it should be mentioned that measuring the doping level in nanoelements is challenging and methods for measuring the doping level in nanoelements with high accuracy are not perfected at the present day.

The appropriateness of low resistivity contact materials are dependent on the material to be deposited on, but metal, metal alloys as well as non-metal compounds like Al, Al—Si, $TiSi_2$, TiN, W, $MoSi_2$, $PtSi$, $CoSi_2$, $WSi_2$, In, AuGa, AuSb, AuGe, PdGe, Ti/Pt/Au, Ti/Al/Ti/Au, Pd/Au, ITO (InSnO), etc and combinations of e.g. metal and ITO can be used. However, the single and combination contacts are not limited to these materials.

One embodiment of the present invention is a semiconductor device, wherein a volume element 105 is arranged in a wrap around configuration on an end portion of a nanoelement 100, as shown in FIG. 3, and the nanoelement 100 is doped and has less than half of the donor or acceptor dopant concentration of the volume element 105.

One embodiment of the present invention is a funnel structure according to FIG. 3, wherein the generally one-dimensional nanoelement 100 is modulation doped by the volume element 105. Thereby the volume element material has a higher band gap than the nanoelement material and due to the doping charge carriers diffuse from the volume element 105 into the nanoelement 100. This is advantageous when doping in combination with high carrier mobility is needed.

One embodiment of the present invention is a semiconductor device comprising a nanoelement-volume element funnel structure, wherein the nanoelement 100 extends partly through the volume element 105, i.e. a wrap around configuration, and wherein the nanoelement 100 changes composition, e.g. from GaAs to GaAsP, approximately where the volume element 105 begins.

Another embodiment is based on a funnel structure comprising a volume element 105 on a nanoelement 100 with a wrap around configuration, wherein the volume element 105 composition gradually approaches or approximately has the same composition as the volume element 105 approximately where the volume element 105 begins. However, the composition of the nanoelement below the volume element may be different from the composition of the volume element.

One embodiment of the present invention is a semiconductor device comprising a nanoelement-volume element funnel structure, wherein the nanoelement 100 is doped to the same conductivity type as the volume element 105. This may be necessary when the nanoelement 100 cannot be doped to the required doping level. An additional carrier injection from the volume element 105 is needed. In addition the access resistance is decreased.

Due to the nanometer dimensions of the nanoelements 100 it is also possible to selectively change the composition along the length thereof, to grow a nanoelement of one composition onto a substrate 110 of another composition, and to form heterojunctions, with maintaining epitaxy despite a significant lattice mismatch. In particular, this allows for attaching a volume element 105 according to the embodiments of the present invention, which is otherwise not possible to grow on the substrate, to the substrate via a nanoelement 100 without introducing significant defects. Heterostructures along the length of the nanoelement 100 or in the volume element 105 may be introduced to enable the semiconductor device to carry out a desired function or to perform according to certain requirements. A heterostructure in a nanoelement comprises at least two lengthwise segments of different composition and/or doping, a first segment of a first material and a second segment of a second material. An epitaxial boundary is present between the first and the second segment, the boundary being limited to a number of lattice planes, wherein the composition or doping changes gradually. In analogy, a heterostructure in a volume element comprises a plurality of concentric segments of different composition.

The nanoelement 100 can be doped to the same or different conductivity when compared to the three-dimensional volume element 105. High doping and low band gap adjustment on the semiconductor side of the contact, as mentioned, a usual tool for reducing the access resistance in common nanoelement devices, can be utilized also for the volume element 105 in the present invention. Moreover the doping level of the volume element 105 may gradually change from the interface to the outer surface, i.e. gradient doping of the volume element 105.

In certain applications, it is advantageous to have heterostructures of the nanoelement 100 and/or the volume element 105 comprising concentric layers of materials of different compositions and/or doping levels. Such a concentric layer of the nanoelement 100 or volume element 105 can also be a dielectric material, or a low resistivity material, e.g. a metal, enclosing at least partly the nanoelement 100 or volume element 105. For example modulation doping, mentioned above, of the nanoelement 100 can be obtained by use of a concentric layer of a doped semiconductor material with a higher band gap than the core material. Typical semiconductor material utilized in concentric layers of the nanoelement 100 and volume element 105 are Ga/As/AlGaAS, AlSb, Si, GaP, InP, InAs, InGaP InPSb, GaInPSb, AlPSb, GaAsSb, InAsP, Al, AlAs, GaAlInAsP, etc. However, the choice of semiconductor materials is not limited to these materials.

Figure 5:
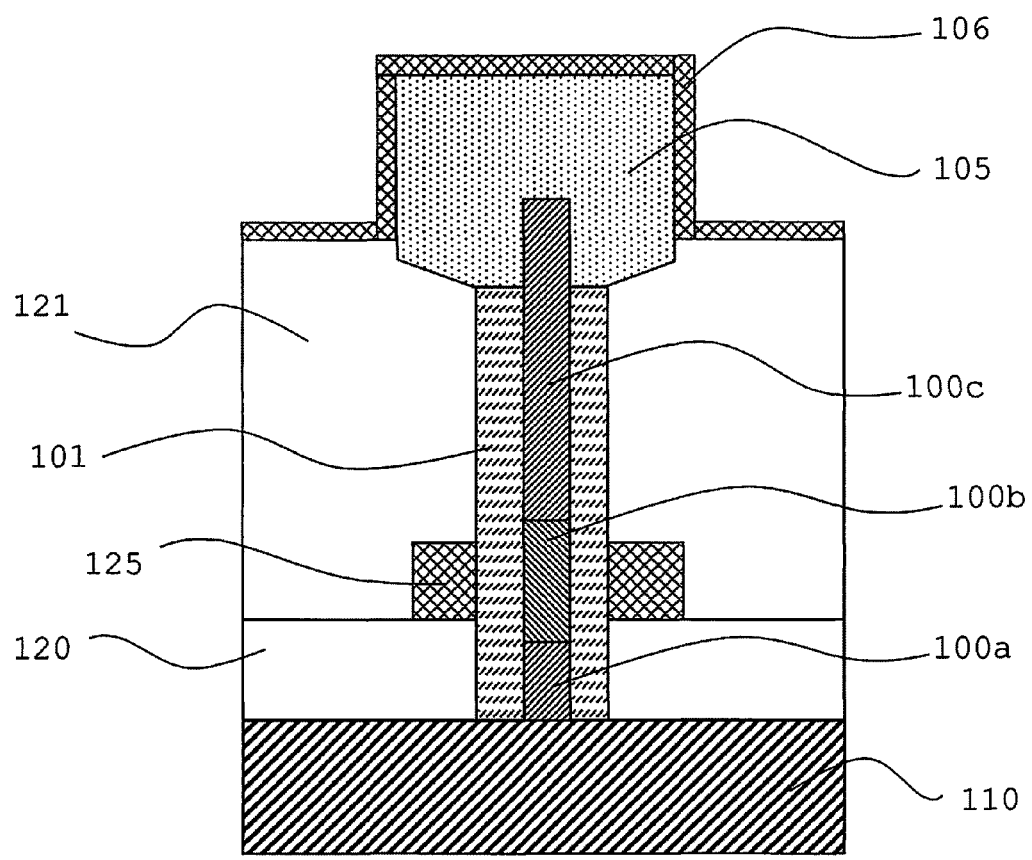
FIG. 5 is a sectional view of EWIGFET in InAs, where the doping and diameter are designed so that the channel is closed at zero gate bias, and a volume element on top ensures a low access resistance.

One embodiment of the present invention that comprises heterostructures along the nanoelement 100 and a concentric layer on the nanoelement 100 is an enhancement nanowire wrap insulating gate field effect transistor (EWIGFET), as illustrated in the schematic sectional view in FIG. 5. The transistor comprises a nanoelement, in this case a VLS grown nanowire, upstanding on a InAs substrate 110, with a first $n^+$-InAs nanoelement segment 100a, a second intrinsic n-type InAs nanoelement segment 100b and a third $n^+$-InAs nanoelement segment 100c, a thin concentric layer 101 of a dielectric material enclosing the part of the nanoelement segments 100a, 100b, 100c that are not enclosed in a $n^+$-InAs volume element 105 arranged on top of the nanoelement segment 100c. Further, a gate electrode 125 in a wrap around configuration is provided in between two filler layers 120, 121 that fill the volume surrounding the nanoelement segments 100a, 100b, 100c and partly also the volume element 105. The dielectric material 101 may act as a gate insulating layer between the gate 125 and the channel 100b of the transistor. A thin film Ni contact 106 is deposited on the top surface of the device. The volume element 105 is utilized to decrease the access resistance partly by doping of the volume element 105 and partly by increasing the contact surface area. The nanoelement 100 in the EWIGFET is made of InAs, wherein the doping and diameter are designed so that the channel is closed at zero gate bias. However the same design applies to other materials than InAs, like InSb, InP, GaAs, Ge and Si. A DWIGFET is obtained when the doping levels are increased in such a way that the channel remains open at zero gate bias.

Figure 6:
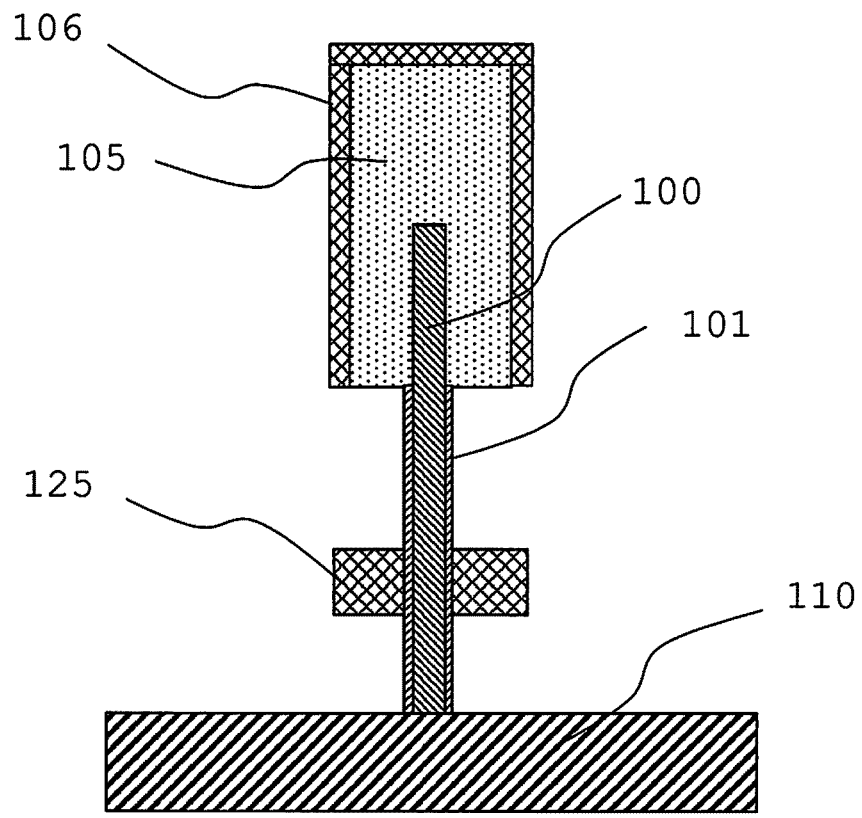
FIG. 6 is a sectional view of a FET device comprising an intrinsic GaAs nanoelement upstanding on a $p^+$-GaP:Zn substrate with a gate electrode and a highly n-doped InGaP volume element arranged in a wrap around configuration on the nanoelement.

In another embodiment, the WIGFET structure described above is simplified and the challenging doping of the nanoelement 100 is excluded. As shown in FIG. 6, an intrinsically p-type GaAs nanoelement 100, with a portion of the nanoelement 100 enclosed in a thin concentric layer 101 of a dielectric material, e.g. $SiO_2$, is upstanding on a $p^+$-GaP:Zn substrate 110 with a $n^+$ InGaP volume element 105 arranged on top of the nanoelement 100, enclosing the portion of the nanoelement that is not covered by the concentric layer 101. A gate electrode 125 is provided in a wrap around configuration along a small portion of the nanoelement 100 between the volume element 105 and the substrate 110. The heavy doping of the volume element 105 makes it a carrier reservoir for the undoped nanoelement 100 and creates a pn-junction in the nanoelement 100. By applying a voltage to the gate electrode 125 a current flows in the nanoelement 100. Layer 101 functions as a gate insulating layer of the transistor. If the gate insulating layer is omitted, then a MESFET type transistor is formed.

Figure 7:
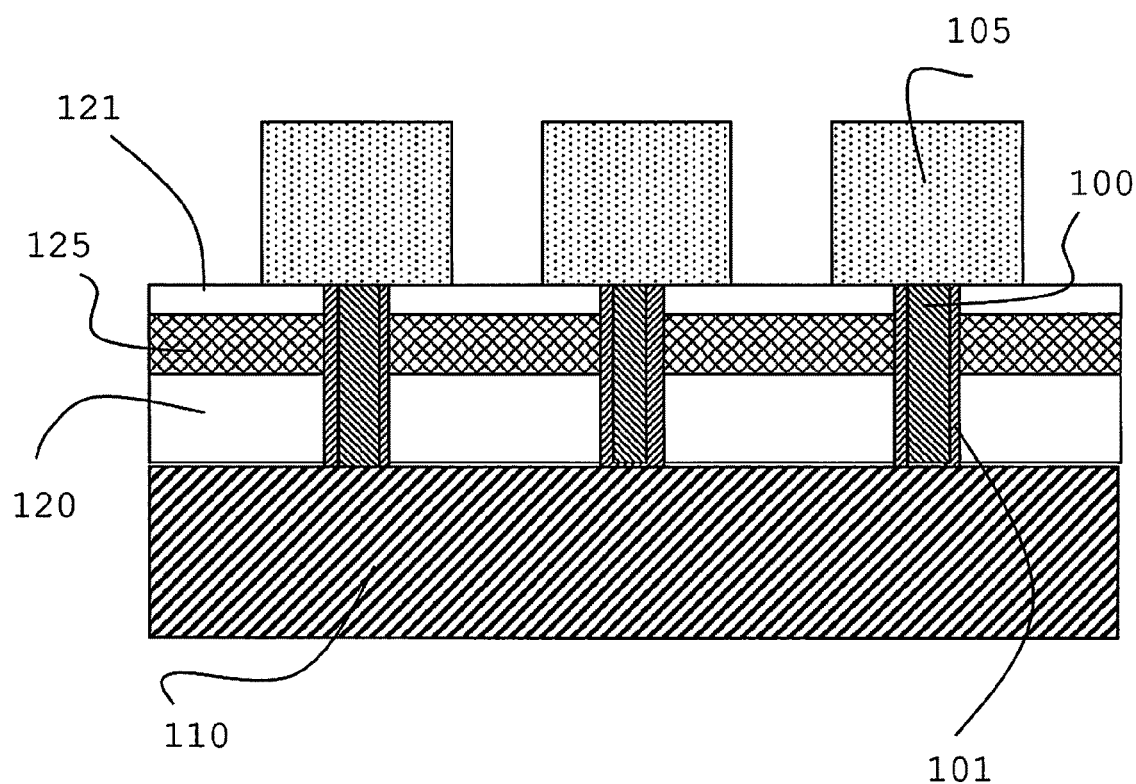
FIG. 7 is a sectional view of an array of FET devices according to FIG. 6, however with the volume element arranged on top of the nanoelement.

Another embodiment of the present invention, similar to the WIGFET structure described above, is a FET structure according to FIG. 7. In this cross sectional view, an array of three FET structures is shown, wherein the volume element 105 is arranged on top of the nanoelement 100 instead of in a wrap around configuration as in FIG. 6.

Furthermore the nanoelement-volume element architecture enhances both electrical and optical performance of a LED. The volume element 105 is doped, either p or n type, in order to be one side of a pn-junction. This region has a certain volume and thickness in order to achieve the necessary doping concentration to decrease internal series resistance and contact resistance, increase carrier injection into the nanoelement 100, while increasing built-in-voltage. The low internal resistance and the increased amount of carriers due to the funnel nature vouch for a high injection of majority carriers into the nanoelement 100 already at low forward voltages. High injection of carriers into the nanoelement 100 introduces high concentrations of electron hole pairs into the nanoelement 100 increasing light emitting recombination. The high concentration of electron-hole pairs, in combination with the active region being extended into a waveguide, directing the light, can enable stimulated emission, increasing the output of the device further.

Also, when using different material compositions in the nanoelement 100 and the volume element 105, the nanoelement 100 material composition can be chosen to propagate into the volume element 105 in order to decrease the optical disturbance by the volume element-nanoelement connection. Extending the length of the nanoelement 100 in the direction of the emitted light will increase re-absorption. To decrease re-absorption the composition of the nanoelement 100 is adjusted in the direction of the emitted light in order to raise the band gap as compared to the energy of the emitted light.

Figure 8:
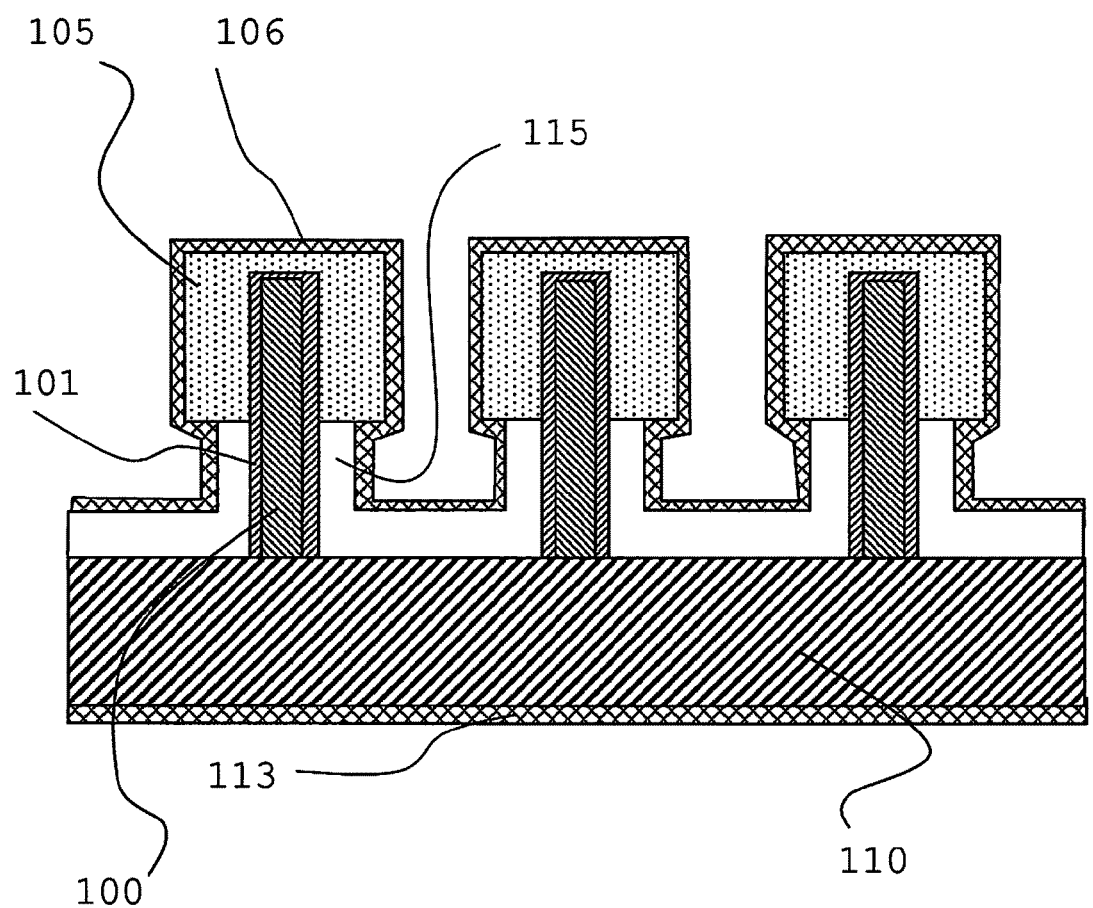
FIG. 8 is a sectional view of an array of three identical LEDs comprising a p-GaAs nanoelement, upstanding on a p-GaP substrate, with a concentric layer of InGaP, a dielectric layer, e.g. $SiO_2$ enclosing the nanoelement, a $n^+$-InGaP:Si volume element and a ITO contact deposited on the circumferential and top surfaces of the volume element.

One embodiment of the present invention is functional as a LED. An array of three identical such LEDs is shown in FIG. 8. An undoped intrinsically p-type GaAs nanoelement 100 with length about 2 μm and diameter about 100 nm, upstanding on a p-doped GaP substrate 110, is completely enclosed in a thin concentric layer 101 of InGaP. The concentric layer 101 is utilized to optimize the wave guiding properties and acts as a cladding layer. An insulating and transparent masking material 115, e.g. SiO2, covers about the lower half of the nanoelement 100. Above this transparent masking material 115 and enclosing the nanoelement 100 there is an InGaP volume element 105, with a diameter of about 500 nm and a length of about 1 μm, heavily doped with Si to obtain an n+-type material. A top electrode 106 is deposited on the top surface and a bottom electrode 113 is deposited on the bottom side of the substrate 110.

Figure 9:
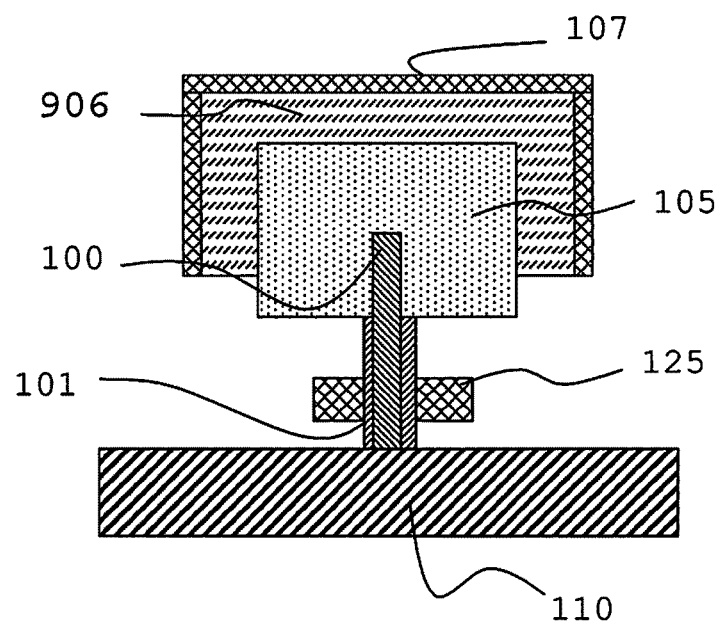
FIG. 9 is a sectional view of a semiconductor device intended for storing charge with a dielectric layer and conductive layer arranged on top of a nanoelement-volume element structure.

In another embodiment the volume element 105 top surface is covered by a first concentric dielectric layer 106 in order to store a charge, e.g. for memory devices. Referring to FIG. 9, this embodiment comprises an intrinsic nanoelement 100 upstanding on a p-type semiconductor substrate 110, a n-doped volume element 105 in a wrap around configuration, a concentric dielectric layer 101 enclosing the portion of the nanoelement 100 that is not enclosed by the volume element 105, a dielectric material 906 deposited on the top and circumferential surfaces of the volume element 105, a second concentric layer 107, i.e. a top electrode on the dielectric material, and a wrap around gate electrode 125. The stored charge can be read out by applying a voltage to the gate electrode 125. The charge storage dielectric may comprise an a capacitor dielectric such that a capacitor is located in electrical contact with the transistor (i.e., a DRAM-type configuration).

Figure 10:
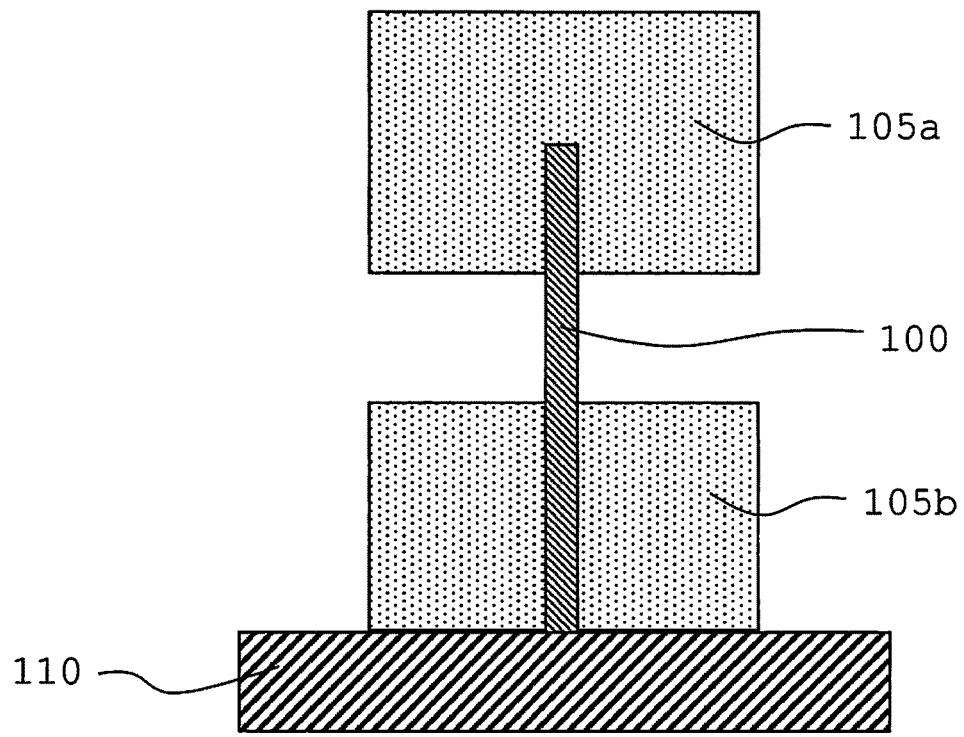
FIG. 10 is a sectional view of a volume element (p)-nanoelement-volume element (n) structure.

The nanoelement-volume element sequence may be repeated along the nanoelement 100. One embodiment is where a first n-doped volume element 105a and second p-doped volume element 105b share a common nanoelement 100 in-between, forming a volume element (p)-nanoelement-volume element (n) structure, shown in FIG. 10. For example, such a structure may advantageously be implemented in LEDs and diodes or as emitter-base and base-collector junctions in hetero-bipolar transistors.

Figure 11:
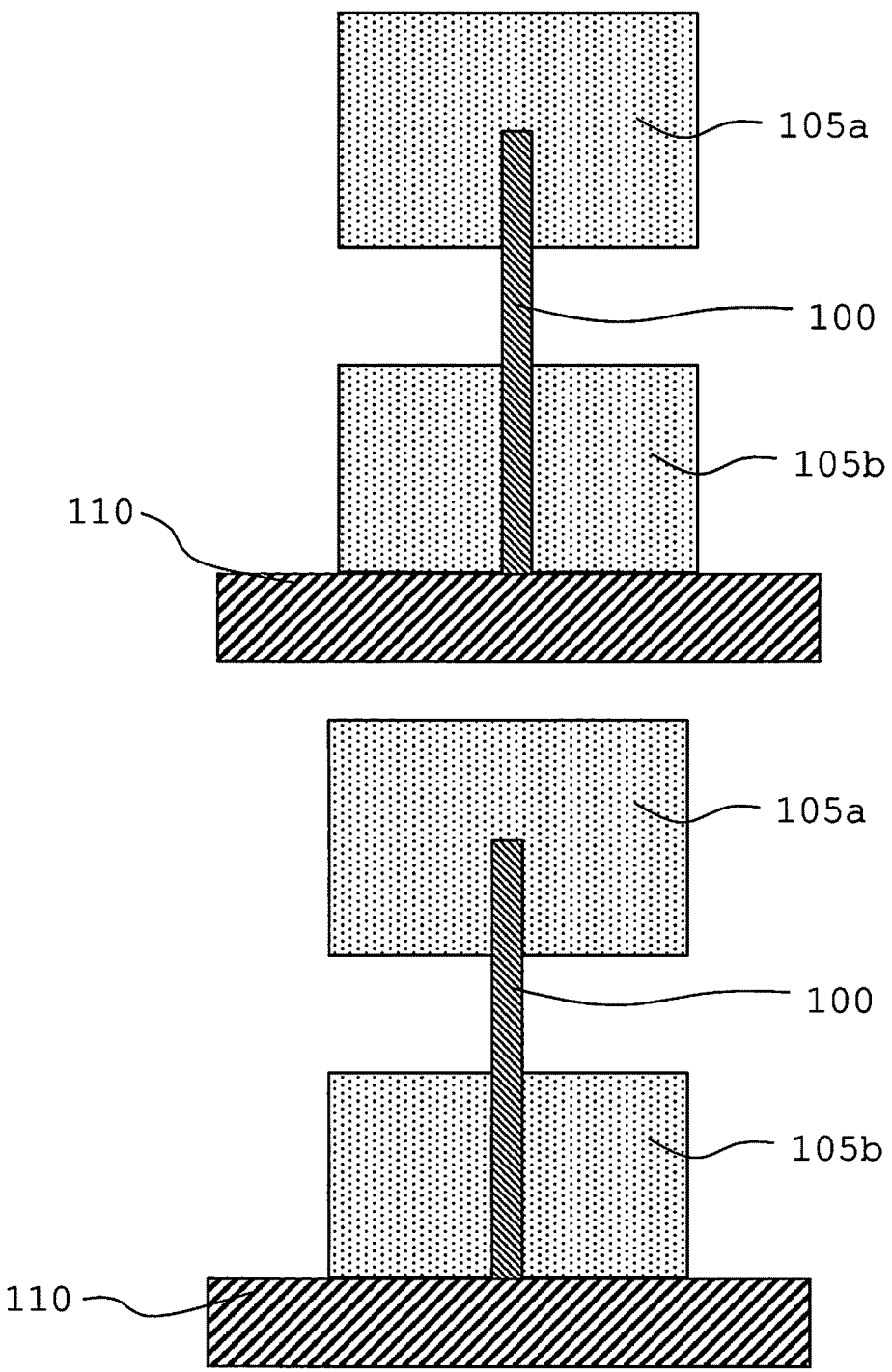
FIG. 11 is a schematic sectional view of a volume element (n)-nanoelement-volume element (n) structure and a volume element (p)-nanoelement-volume element (p) structure.

Another embodiment is when a first volume element 105a and second volume element 105b of common conductivity type (n or p and individually ohmically connected to a circuitry) are connected through a nanoelement 100 where a non-ohmic terminal altogether forming a volume element (n)-nanoelement-volume element (n) or volume element (p)-nanoelement-volume element (p) structure, as shown in FIG. 11, whereby charge carriers of the proper type are injected into the nanoelement 100.

Figure 12:
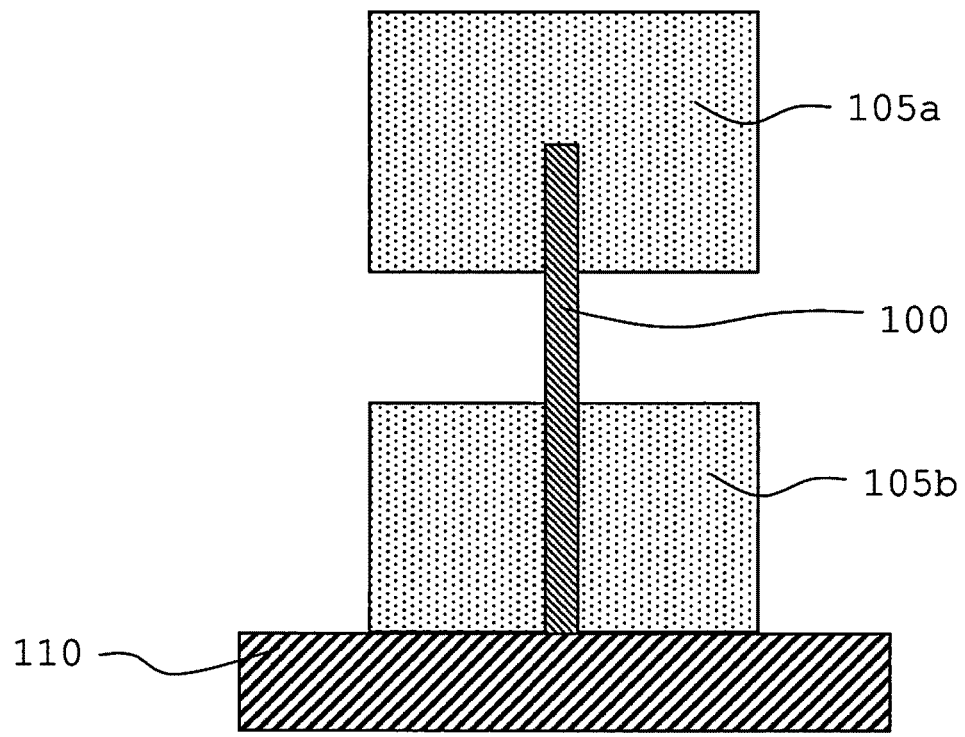
FIG. 12 is a funnel structure comprising a $p^+$ volume element in series with a intrinsic nanoelement and a n-type nanoelement, wherein the doping levels and dimensions are adjusted to have a pn-junction with essentially the whole depletion region located in the nanoelement, making it functional as a sensor.

One embodiment of the present invention is particularly useful as a sensor. According to FIG. 12 this structure comprises two volume elements 105a, 105b, one n-type volume element 105b at the bottom, in conjunction with the substrate 110, and one $p^+$-type volume element 105a arranged in a wrap around configuration on top of the nanoelement 100 that is upstanding on the substrate 110 and extending through the lower volume element 105b. Hence a pn-junction is formed and the volume of the active region, i.e. the depletion region, appreciably coincides with the one-dimensional region in the funnel structure, close to the junction between the nanoelement 100 and the upper volume element 105a. The one-dimensional region is easily depleted due to low doping ion concentration and low volume, since the total amount of charge moved is low. However, the high doping concentration together with a larger volume of the volume elements 105a, 105b gives that the depletion region will protrude into less volume and, especially, less distance in the direction of transport in the volume element 105a. This makes it possible to design the nanoelement length to closely define the depletion region. Thereby the depletion resistance is minimized, or defined by the length of the nanoelement 100, and the main part of the active region will be in the nanoelement 100.

Figure 13:
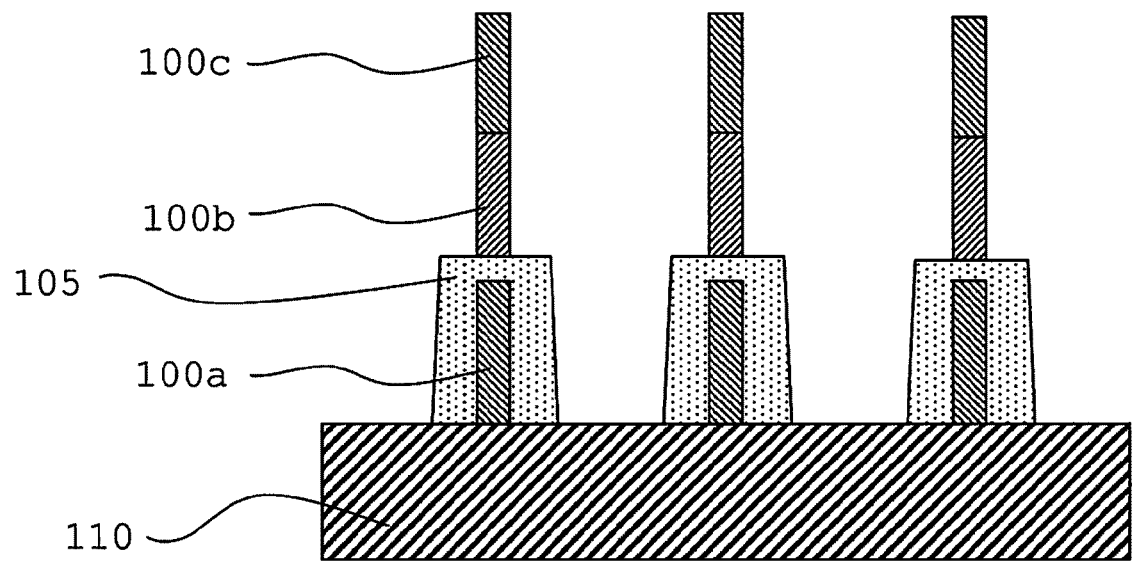
FIG. 13 is a sectional view of a funnel structure with three heterostructure segments in a nanoelement extending with a volume element in contact with a semiconductor substrate enclosing the first heterostructure segment.
Figure 14:
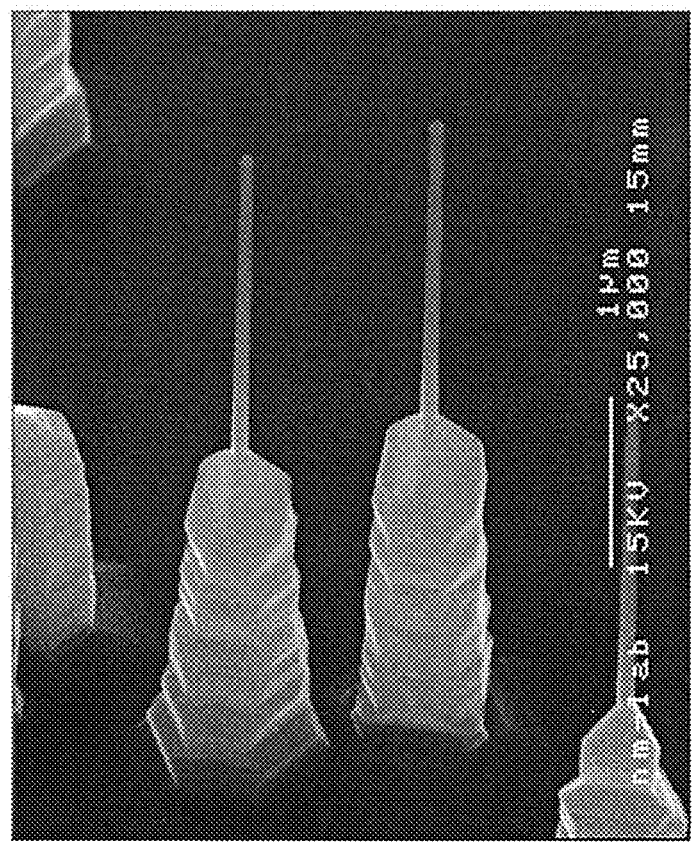
FIG. 14 is a scanning electron microscope micrograph showing a funnel structure according to FIG. 13.

One embodiment comprising a heterostructure in the one dimensional nanoelement 100 is a funnel structure as the one shown in the schematic drawing in FIG. 13 and in the scanning electron microscope micrograph in FIG. 14. A one-dimensional nanoelement, comprising a first nanoelement segment 100a of GaP, a second nanoelement segment 100b of GaAsP and a third nanoelement segment 100c of GaP, is upstanding on a semiconductor substrate 110. The first segment 100a is fully enclosed in a three-dimensional GaP volume element 105. This structure decreases the injection resistance from the substrate 110 into the nanoelement segment 100a. This is also the case in an alternative embodiment (not shown) comprising the nanoelement segment 100a, the volume element 105 and only the nanoelement segment 100c, all made of GaP.

Figure 15:
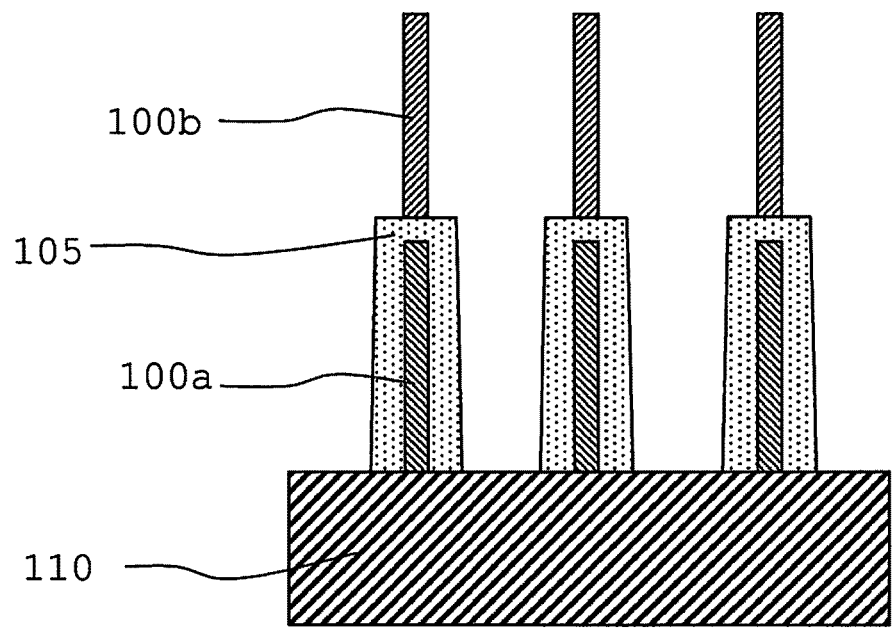
FIG. 15 is a cross sectional view of a volume element-nanoelement funnel structure with one nanoelement enclosed in the volume element and another nanoelement arranged on top of the volume element.
Figure 16:
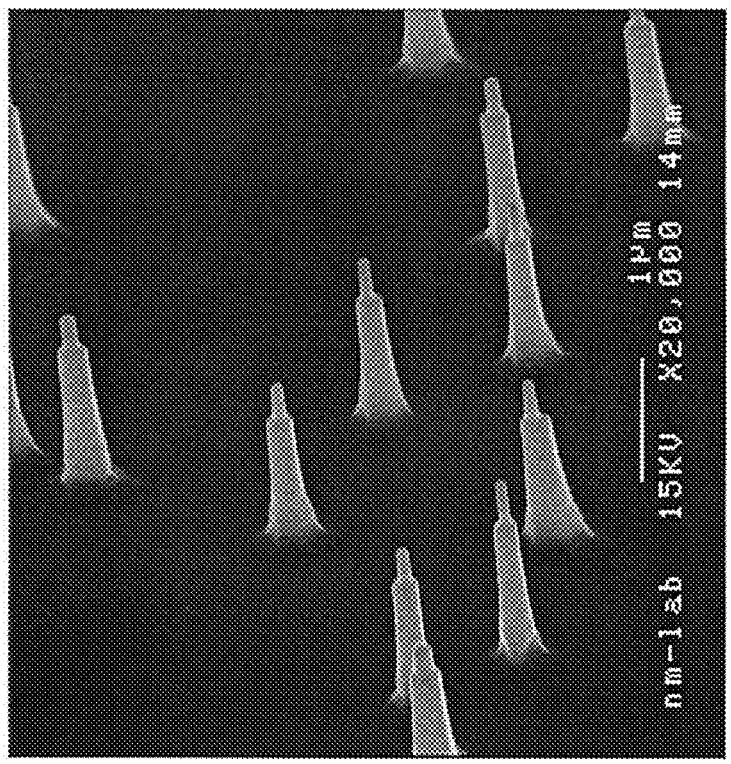
FIG. 16 is a scanning electron microscope micrograph showing a funnel structure according to FIG. 15.

A similar structure is the funnel structure shown in the schematic drawing in FIG. 15 and in the scanning electron microscope micrograph in FIG. 16, providing another embodiment of the present invention, wherein a first one-dimensional nanoelement 100a made of GaAsP is enclosed, both on the cylindrical mantle surface and on the top, by an InGaP volume element 105. The one-dimensional nanoelement 100b visible in FIG. 16 is grown on top of the volume element 105.

Figure 17:
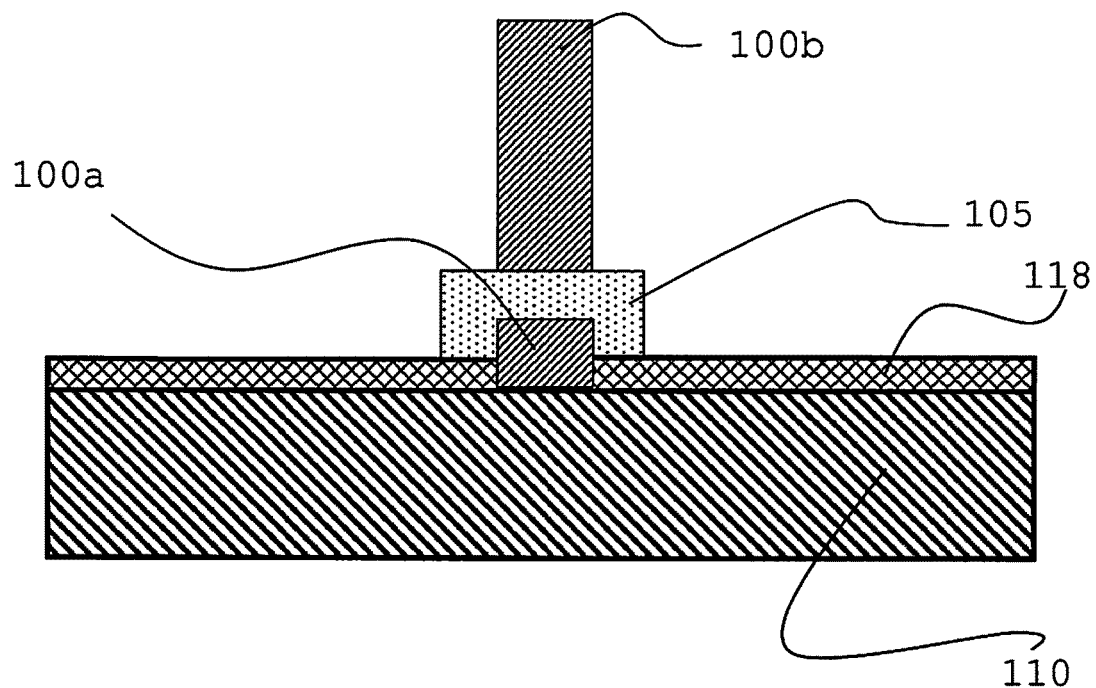
FIG. 17 is a sectional view of a volume element arranged on a relatively short nanoelement enabling lattice mismatch between the volume element and the substrate.

Another embodiment, similar to the embodiments referring to FIGS. 13 and 15 above, is shown in FIG. 17. In this embodiment, a patterned low resistivity layer 118, such as conductor or electrode, preferably a metal layer, is provided on the substrate 110. Layer 118 contains a small hole. A nanoelement segment 100a fills up the hole and protrudes sufficiently to enable radial growth of the volume element 105 that is enclosing the nanoelement segment 100a, whereby the volume element 105 forms an ohmic contact between the low resistivity layer 118 and the semiconductor device. A second nanoelement segment 100b is upstanding from the volume element 105. In particular, this embodiment is useful when a non-conducting substrate is used and a metallic contact, preferably lithographically defined, is desired to a single crystal or high quality polycrystalline semiconductor volume element.

Figure 18:
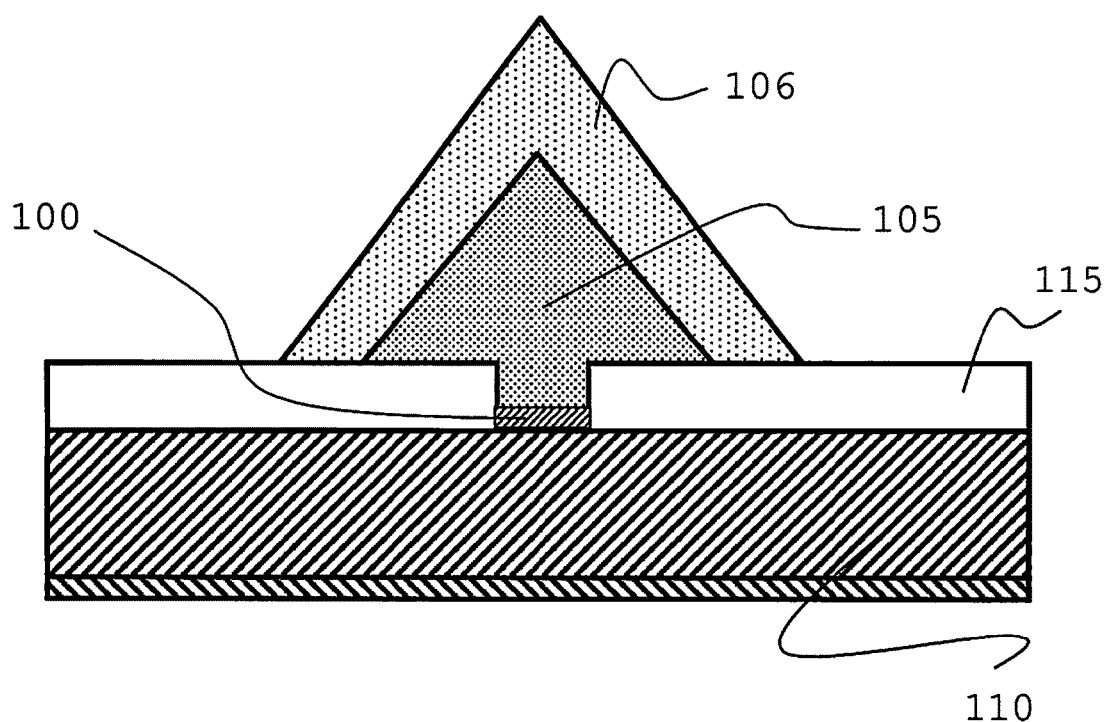
FIG. 18 is a cross sectional view of a volume element arranged on a short nanoelement contacting a patterned low resistivity layer on a substrate.

Another embodiment of the present invention is a light emitting device, where the nanoelement's main function is to provide a good heterojunction between a substrate 110 and a volume element 105 that normally are impossible to combine due to too large lattice mismatch, i.e. the nanoelement 100 is utilized as a very thin template bridging the incompatible materials. In FIG. 18 an undoped InGaN nanoelement 100 is grown on a $n^+$ GaN/Sapphire substrate 110 through a silicon nitride mask 115 allowing for a $p^+$ GaN volume element 105 on top with an optional contact 106.

Figure 19:
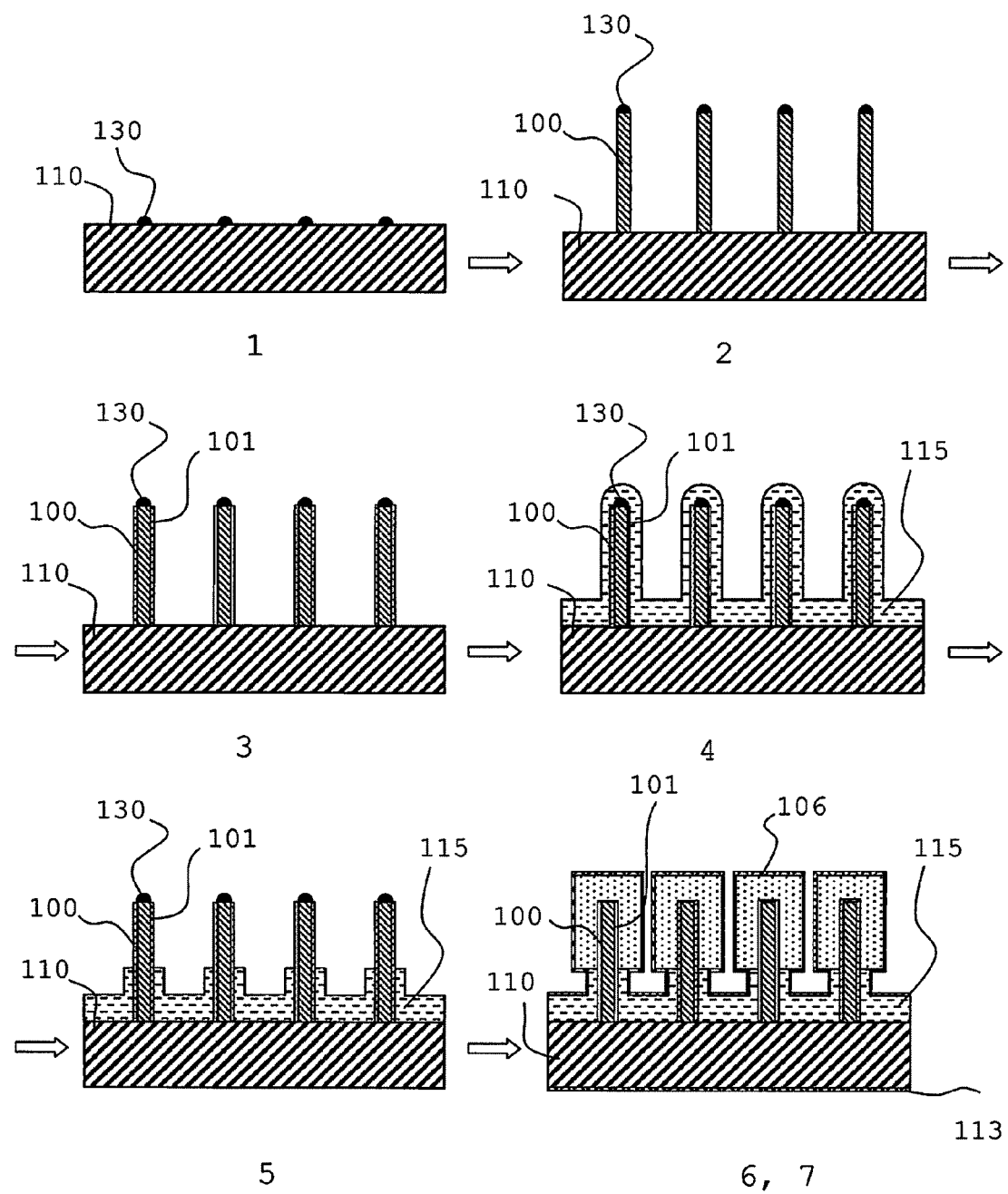
FIG. 19 is an illustration of one processing scheme for a LED device utilizing VLS growth of a nanoelement and growth of a volume element on top.

A method of fabricating funnel structures is to first grow a nanoelement 100, mask the intended nanoelement 100 with a masking layer 115 and re-grow selectively the intended volume element 105, as shown in FIG. 19. The volume element 105 grows both in axial and radial directions. Hence, when the nanoelement 100 is masked partly, the nanoelement 100 becomes enclosed in the volume element 105. Appropriate masking materials are e.g. silicon nitride, silicon oxide, etc.

Considering systems where nanoelement growth is locally enhanced by a substance, as VLS grown nanowires, the ability to alter between radial and axial growth by altering growth conditions enables the procedure (nanowire growth, mask formation, and subsequent selective growth) that can be repeated to form nanoelement-volume element sequences of higher order. For systems where nanoelement growth and selective growth are not distinguished by separate growth conditions it may be better to first grow the nanoelement 100 along the length and by different selective growth steps grow different types of volume element 105 regions.

Suitable methods for growing nanowires on semiconductor substrates are described in U.S. Published Application 2003/010244. Methods of providing epitaxially grown nanowires with heterostructures are to be found in U.S. Published Application 2004/0075464. The funnel structures of the embodiments of the present invention are produced using modifications of methods according to the mentioned patent applications as described in the following.

A fabrication method according to the embodiment of the present invention will be exemplified with the fabrication of a light emitting pn-diode/array with active nanowire region(s), illustrated in FIG. 19. The method comprises the steps of 1. definition of local catalyst/catalyst islands 130 on a p+ GaP substrate 110 by lithography,
2. GaAs nanowire 100 growth from the local catalyst islands 130,
3. radial growth of thin InGaP concentric layer 101 around the nanowire 100,
4. deposition of $SiO_2$ as a mask material 115,
5. partial etch back of mask 115 to expose the upper parts of the nanowires 100,
6. selective epitaxial growth of n+ InGaP volume element 105, and 7. contact 106, 113 formation on the volume element and to the substrate, respectively.

The volume element is either doped (8) during the growth or afterwards (not shown).

Concentric layers (106,101) may optionally be grown both on the volume element (105) and the nanoelement (100).

While the invention has been described in connection with what is presently considered to be the most practical and preferred embodiments, it is to be understood that the invention is not to be limited to the disclosed embodiments, on the contrary, is intended to cover various modifications and equivalent arrangements within the appended claims. All publications and patent applications disclosed herein are incorporated by reference in their entirety.

The invention claimed is:

1. A semiconductor device, comprising:
   A) a substrate;
   B) a semiconductor light emitting device funnel structure, comprising:
      a) a semiconductor nanowire protruding upstanding from a surface of the substrate;
      b) a three dimensional, doped semiconductor volume element shell enclosing a first end portion of a circumferential surface of the nanowire, wherein the volume element shell of the funnel structure is in epitaxial connection with the nanowire of the funnel structure, and wherein the volume element shell does not enclose at least a second portion of a circumferential surface of the nanowire; and
   C) a first electrode in contact with the volume element shell,
   wherein the first end portion enclosed by the volume element is equal to or less than half a length of the nanowire.

2. The semiconductor device according to claim 1, wherein the substrate comprises a doped semiconductor substrate and the doped semiconductor volume element shell is doped to a different type of conductivity than the doped semiconductor substrate, forming a pn-junction by injection of carriers to the nanowire from the volume element shell.

3. The semiconductor device according to claim 2, wherein:
   the nanowire is doped to different conductivity type than the volume element shell;
   a diameter of the nanowire is 100 to 500 nm; and
   a thickness of the volume element shell is at least 150 nm.

4. The semiconductor device according to claim 2, further comprising:
   D) a second electrode in contact with the semiconductor substrate.

5. The semiconductor device according to claim 2, wherein the first electrode in contact with the volume element shell comprises a first portion which encloses an upper portion of a circumferential surface of the volume element shell, such that the first electrode does not enclose a lower portion of the circumferential surface of the volume element shell.

6. The semiconductor device according to claim 5, wherein the first electrode in contact with the volume element shell further comprises a second portion which is located laterally from the volume element shell and the second portion of the first electrode extends substantially parallel to the surface of the substrate.

7. The semiconductor device according to claim 2, wherein the first end portion enclosed by the volume element is equal to one eighth a length of the nanowire.

* * * * *